(12) United States Patent
Fujiwara et al.

(10) Patent No.: US 9,425,766 B2
(45) Date of Patent: *Aug. 23, 2016

(54) ELASTIC WAVE ELEMENT, AND ELECTRICAL APPARATUS AND DUPLEXER USING SAME

(75) Inventors: Joji Fujiwara, Osaka (JP); Yosuke Hamaoka, Osaka (JP); Tetsuya Tsurunari, Osaka (JP); Hidekazu Nakanishi, Osaka (JP); Hiroyuki Nakamura, Osaka (JP)

(73) Assignee: SKYWORKS PANASONIC FILTER SOLUTIONS JAPAN CO., LTD., Kadoma-Shi (JP)

( * ) Notice: Subject to any disclaimer, the term of this patent is extended or adjusted under 35 U.S.C. 154(b) by 339 days.

This patent is subject to a terminal disclaimer.

(21) Appl. No.: 13/390,115

(22) PCT Filed: Oct. 29, 2010

(86) PCT No.: PCT/JP2010/006390
§ 371 (c)(1),
(2), (4) Date: Feb. 13, 2012

(87) PCT Pub. No.: WO2011/052218
PCT Pub. Date: May 5, 2011

(65) Prior Publication Data
US 2012/0139662 A1 Jun. 7, 2012

(30) Foreign Application Priority Data
Nov. 2, 2009 (JP) .................. 2009-251696

(51) Int. Cl.
*H03H 9/64* (2006.01)
*H03H 9/72* (2006.01)
(Continued)

(52) U.S. Cl.
CPC ............. *H03H 9/02559* (2013.01); *H03H 9/64* (2013.01); *H03H 9/1452* (2013.01)

(58) Field of Classification Search
CPC ... H03H 9/02559; H03H 9/0222; H03H 3/08; H03H 3/10
USPC .................... 333/193–196; 310/313 A–313 D
See application file for complete search history.

(56) References Cited

U.S. PATENT DOCUMENTS 6,246,302 B1 6/2001 Muller et al.
8,698,578 B2* 4/2014 Nakanishi .......... H03H 9/02559
333/133

(Continued)

FOREIGN PATENT DOCUMENTS

CN 101128977 A 2/2008
CN 101379699 A 3/2009
(Continued)

OTHER PUBLICATIONS

Chinese Office Action (in English language) issued Jan. 2, 2014 in CN 201080038417.7 which corresponds to the present application, Search Report.

(Continued)

*Primary Examiner* — Dean Takaoka
*Assistant Examiner* — Alan Wong
(74) *Attorney, Agent, or Firm* — Lando & Anastasi, LLP

(57) ABSTRACT

An acoustic wave device includes a piezoelectric substrate made of a lithium niobate material having the Euler angles ($\phi$, $\theta$, $\psi$), an electrode disposed on the piezoelectric substrate for exciting a major acoustic wave of a wavelength $\lambda$, and a protective layer disposed on the piezoelectric substrate to cover the electrode. The protective layer has a thickness greater than $0.27\lambda$. The Euler angles satisfy $-100° \le \theta \le -60°$; $1.193\phi - 2° \le \psi \le 1.193\phi + 2°$; and either $\psi \le -2\phi - 3°$ or $-2\phi + 3° \le \psi$.

15 Claims, 21 Drawing Sheets

(51) Int. Cl.
*H03H 9/02* (2006.01)
*H03H 9/145* (2006.01)

(56) References Cited

U.S. PATENT DOCUMENTS

| | | |
|---|---|---|
| 2001/0008387 A1 | 7/2001 | Taniguchi |
| 2004/0061575 A1 | 4/2004 | Kando et al. |
| 2007/0090898 A1 | 4/2007 | Kando |
| 2007/0096592 A1 | 5/2007 | Kadota et al. |
| 2007/0241840 A1 | 10/2007 | Takayama et al. |
| 2008/0116993 A1 | 5/2008 | Yamakawa et al. |
| 2009/0115287 A1 | 5/2009 | Kando |
| 2009/0206955 A1 | 8/2009 | Iizawa |
| 2010/0164646 A1 | 7/2010 | Nakanishi et al. |
| 2010/0207707 A1 | 8/2010 | Yata |
| 2010/0219905 A1 | 9/2010 | Nakamura et al. |
| 2012/0218052 A1 | 8/2012 | Tsurunari et al. |

FOREIGN PATENT DOCUMENTS

| | | |
|---|---|---|
| CN | 101515792 | 8/2009 |
| EP | 1 971 026 | 9/2008 |
| JP | H07154199 A | 6/1995 |
| JP | H07283688 A | 10/1995 |
| JP | 2001500697 A | 1/2001 |
| JP | 2001203556 A | 7/2001 |
| JP | 2004-135267 | 4/2004 |
| JP | 2006-295976 | 10/2006 |
| JP | 2008-078981 | 4/2008 |
| JP | 2008532334 A | 8/2008 |
| WO | 9812806 A1 | 3/1998 |
| WO | 2005/034347 | 4/2005 |
| WO | 2005060094 A1 | 6/2005 |
| WO | 2006/003933 | 1/2006 |
| WO | 2006093063 A1 | 9/2006 |
| WO | 2006/114930 | 11/2006 |
| WO | 2007094368 A1 | 8/2007 |
| WO | 2009119007 A1 | 10/2009 |

OTHER PUBLICATIONS

International Search Report issued Dec. 14, 2010 in International (PCT) Application No. PCT/JP2010/006390.

* cited by examiner

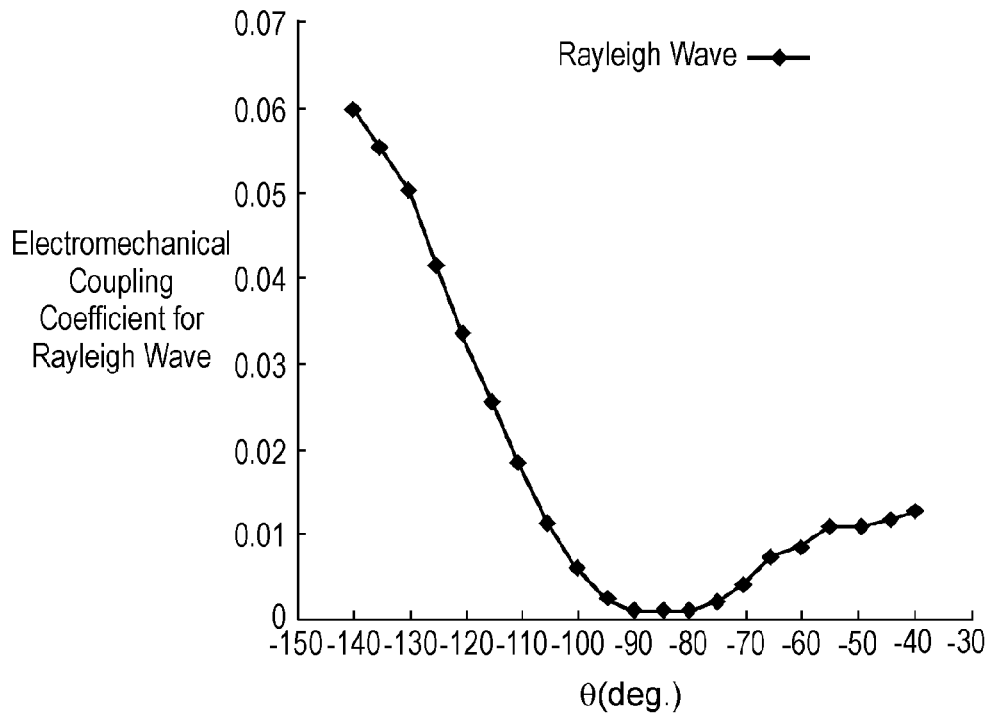
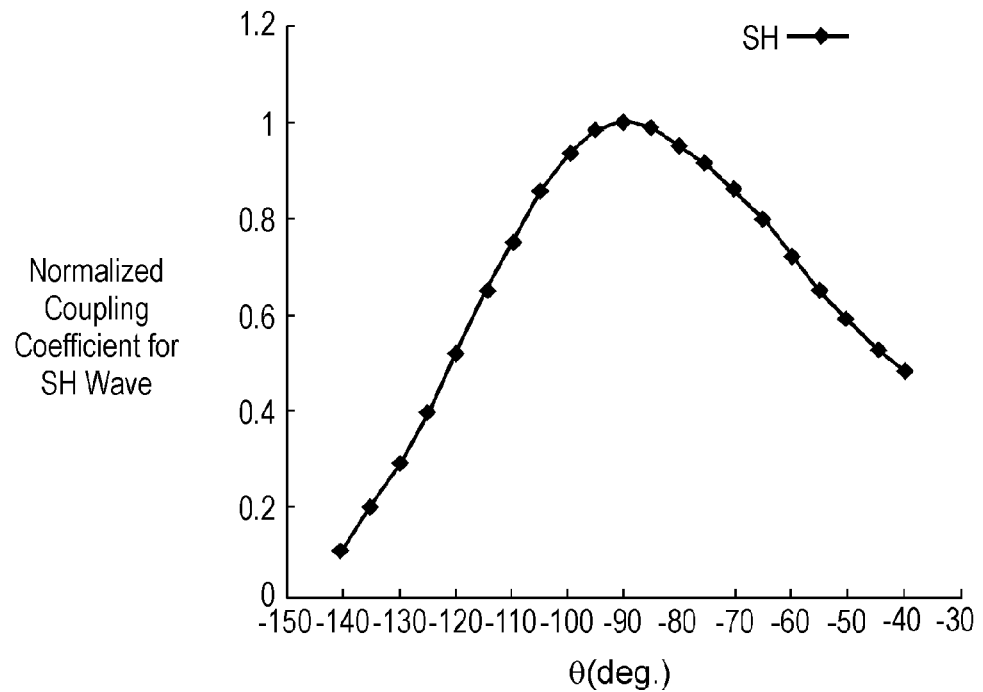

ELASTIC WAVE ELEMENT, AND ELECTRICAL APPARATUS AND DUPLEXER USING SAME

This application is a U.S. national stage application of the PCT international application No. PCT/JP2010/006390, filed Oct. 29, 2010.

TECHNICAL FIELD

The present invention relates to an acoustic wave device and a duplexer and an electronic apparatus including the acoustic wave device.

BACKGROUND ART

Conventional acoustic wave devices will be explained with reference to drawings. FIG. 18 is a schematic cross sectional view of a conventional acoustic wave device.

As shown in FIG. 18, the conventional acoustic wave device includes a piezoelectric substrate 2, electrodes 3, and a protective layer 4. The piezoelectric substrate 2 is made of a lithium niobate material which has, e.g. the Euler angles (0°, −87.5°, 0°). The electrodes 3 may be made of copper disposed on the piezoelectric substrate 2 for exciting major acoustic waves of a wavelength λ. The protective layer 4 is made of silicon oxide disposed on the piezoelectric substrate 2 to cover the electrodes 3.

The protective layer of in the conventional acoustic wave device 1 may have a thickness of, e.g. 0.35° to improve thermal characteristics of the conventional acoustic wave device 1. In this case, undesired spurious emissions are generated at a frequency about 1.2 times the resonant frequency, as shown in FIGS. 19 and 20 (See the region enclosed by a dotted line).

FIG. 19 is a characteristic diagram of a sample the conventional acoustic wave device 1 where the piezoelectric substrate 2 is made of a lithium niobate material which has the Euler angles (0°, −87.5°, 0°), the electrodes 3 are made of copper with a thickness of 0.03λ, and the protective layer 4 is made of silicon oxide with a thickness of 0.35λ and has a planar upper surface.

FIG. 20 is a characteristic diagram showing another sample of the conventional acoustic wave device 1 where the piezoelectric substrate 2 is made of a lithium niobate material which has the Euler angles (0°, −90°, 0°), the electrodes 3 are made of aluminum with a thickness of 0.08λ, and the protective layer 4 is made of silicon oxide with a thickness of 0.35λ and has a projection on the upper surface above each electrode finger of the electrodes 3.

The vertical axis in each of FIGS. 19 and 20 represents normalized admittance with respect to a matching value. The horizontal axis in each of FIGS. 19 and 20 represents normalized frequency with respect to a half the frequency of a slow transverse wave (at a speed of 4024 m/s) which appears in the acoustic wave device 1. It is noted that the vertical axis and the horizontal axis are equally assigned throughout the other characteristic diagrams in this specification.

Undesired spurious emissions shown in FIGS. 19 and 20 are generated by a fast transverse wave produced in the acoustic wave device 1. In this specification that the fast transverse wave is the fastest one of the transverse waves produced in the acoustic wave device 1 and the slow transverse wave is the slowest one of the transverse waves.

FIGS. 21A to 21C are characteristic diagrams of the conventional acoustic wave device 1 with the protective layer 4 having various thicknesses while the piezoelectric substrate 2 is made of a lithium niobate material which has the Euler angles (0°, −87.5°, 0°), the electrodes 3 are made of copper with a thickness of 0.03λ, and the protective layer 4 is made of silicon oxide and has a planar upper surface. FIG. 21A illustrates the relationship between the thickness of the protective layer 4 and an electromechanical coupling coefficient (k2) for the fast transverse wave. FIG. 21B illustrates the relationship between the thickness of the protective layer 4 and the Q value (Qs) of resonance. FIG. 21C illustrates the relationship between the thickness of the protective layer 4 and the Q value (Qa) of anti-resonance.

As shown in FIG. 21B, the Q value of resonance of the fast transverse wave increases when the thickness of the protective layer 4 is greater than 0.27λ. As shown in FIG. 21C, the Q value of anti-resonance of the fast transverse wave increases when the thickness of the protective layer 4 is greater than 0.34λ.

FIGS. 22A to 22C are characteristic diagrams of the conventional acoustic wave device 1 including the protective layer 4 having various thicknesses. It is noted that the piezoelectric substrate 2 is made of a lithium niobate material which has the Euler angles (0°, −90°, 0°), the electrodes 3 are made of aluminum with a thickness of 0.08λ, and the protective layer 4 is made of silicon oxide and has a projection on the upper surface above each electrode finger of the electrodes 3.

FIG. 22A illustrates the relationship between the thickness of the protective layer 4 and the electromechanical coupling coefficient (k2) for the fast transverse wave. FIG. 22B illustrates the relationship between the thickness of the protective layer 4 and the Q value (Qs) of resonance. FIG. 22C illustrates the relationship between the thickness of the protective layer 4 and the Q value (Qa) of anti-resonance.

As shown in FIG. 22B, the Q value of resonance of the fast transverse wave increases when the thickness of the protective layer 4 is greater than 0.2λ. As shown in FIG. 22C, the Q value of anti-resonance of the fast transverse wave increases when the thickness of the protective layer 4 is greater than 0.27λ.

The conventional acoustic wave device 1 has a drawback that characteristics of a filter or a duplexer employing the conventional acoustic wave device 1 declines by the undesired spurious emissions generated by the fast transverse wave.

For the purpose of attenuating the undesired spurious emissions, φ and ψ out of the Euler angles (φ, θ, ψ) of the piezoelectric substrate 2 are modified.

FIGS. 23A to 23G and 24A to 24G are characteristic diagrams of the conventional acoustic wave device 1 when φ and ψ out of the Euler angles (φ, θ, ψ) of the piezoelectric substrate 2 are modified. More particularly, FIGS. 23A to 23G illustrate the characteristic diagrams where φ out of the Euler angles is varied while FIGS. 24A to 24G illustrate the characteristic diagrams where ψ out of the Euler angles is varied. It is noted that the piezoelectric substrate 2 is made of a lithium niobate material, the electrodes 3 are made of aluminum with a thickness of 0.08λ, and the protective layer 4 is made of silicon oxide and has a projection on the upper surface above each electrode finger of the electrodes 3.

The upper sections in FIGS. 23A to 23G and 24A to 24G illustrate the Euler angles (φ, θ, ψ) of the piezoelectric substrate 2. FIGS. 23A to 23G and 24A to 24G do not show the admittance greater than 1e+02 and smaller than 1e−02 of the acoustic wave device.

As shown in FIGS. 23A to 23G and 24A to 24G, the desired spurious emissions can be attenuated when either φ or ψ out of the Euler angles is varied (See FIGS. 23A, 23G, 24A and 24G). Even after the compensation, desired spurious emissions other than the above mentioned undesired spurious emissions are generated. Such undesired spurious emissions may derive from a Rayleigh wave.

One known example of the prior art with reference to the invention is disclosed in Patent Document 1.

CITATION LIST

Patent Literature

Patent Literature 1: WO2005-034347

SUMMARY OF THE INVENTION

In view of the above described drawback, the present invention provides an acoustic wave device designed for, even when the thickness of a protective layer thereof is greater than a predetermined thickness, suppressing the generation of undesired spurious emissions derived from a Rayleigh wave and simultaneously attenuating the desired spurious emissions generated by a fast transverse wave.

One aspect of the acoustic wave device according to the present invention includes a piezoelectric substrate made of a lithium niobate material having the Euler angles (φ, θ, ψ), electrodes disposed on the piezoelectric substrate for exciting a major acoustic wave of a wavelength λ, and a protective layer having a thickness of greater than 0.27λ and disposed on the piezoelectric substrate so as to cover the electrodes. The Euler angles satisfy: $-100° \leq \theta \leq -60°$ and $1.193\phi-2° \leq \psi \leq 1.193\phi+2°$; or $\psi \leq -2\phi-3°$ and $-2\phi+3° \leq \psi$.

Another aspect of the acoustic wave device according to the present invention includes a piezoelectric substrate made of a lithium niobate material having the Euler angles (φ, θ, ψ), electrodes disposed on the piezoelectric substrate for exciting a major acoustic wave of a wavelength λ, and a protective layer having a thickness of greater than 0.2λ and disposed on the piezoelectric substrate so as to cover the electrodes. The protective layer has a projection thereof arranged above each electrode finger of the electrodes. The width of the top of the projection is smaller than the width of each electrode finger of the electrodes. The Euler angles satisfy: $-100° \leq \theta \leq -60°$, $1.193\phi-2° \leq \psi \leq 1.193\phi+2°$; and either $\psi \leq -2\phi-3°$ or $-2\phi+3° \leq \psi$.

BRIEF DESCRIPTION OF THE DRAWINGS

FIG. 6 is a graphic diagram of the acoustic wave device in accordance with the first embodiment of the present invention, illustrating a profile of an electromechanical coupling coefficient of the Rayleigh wave in the acoustic wave device when θ out of the Euler angles (φ, θ, ψ) of the piezoelectric substrate changes.

FIG. 7 is a graphic diagram of the acoustic wave device of the first embodiment of the present invention, illustrating a profile of a normalized coupling coefficient of an SH wave in the acoustic wave device when θ out of the Euler angles (φ, θ, ψ) of the piezoelectric substrate changes.

DETAIL DESCRIPTION OF THE INVENTION

First Exemplary Embodiment

Figure 1:
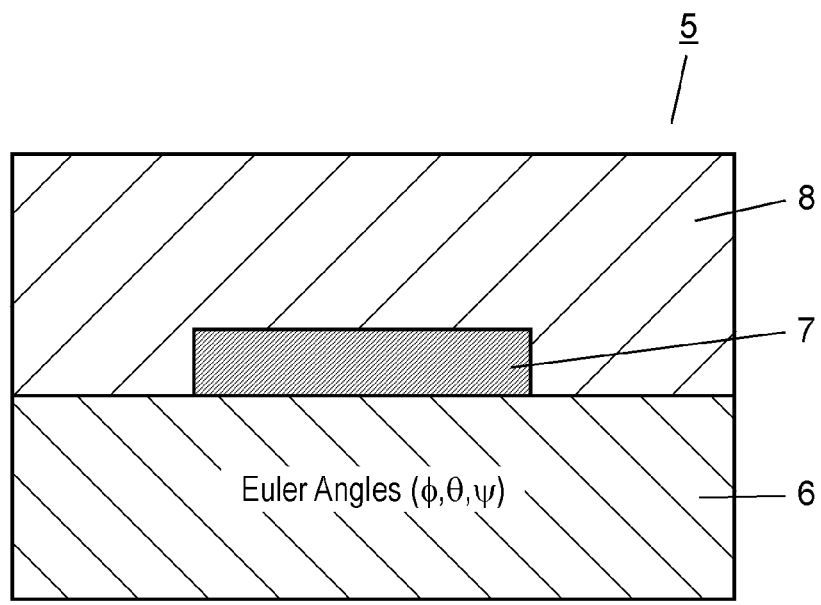
FIG. 1 is a schematic cross sectional view of an acoustic wave device in accordance with a first exemplary embodiment of the present invention.

An acoustic wave device in accordance with the first exemplary embodiment of the present invention will be described below referring to the relative drawings. FIG. 1 is a schematic cross sectional view of the acoustic wave device 5 according to the first embodiment of the present invention.

As shown in FIG. 1, the acoustic wave device 5 includes a piezoelectric substrate 6, electrodes 7, and a protective layer 8. The electrodes 7 are disposed on the piezoelectric substrate 6 and are inter-digital transducer (IDT) electrodes for exciting a major acoustic wave which consists of, for example, a shear horizontal (SH) wave of a wavelength $\lambda$. The protective layer 8 is disposed on the piezoelectric substrate 6 to cover the electrodes 7, and made of, for example, silicon oxide having a thickness of greater than $0.27\lambda$.

The piezoelectric substrate 6 is a piezoelectric substrate made of a lithium niobate material ($LiNbO_3$) and has the Euler angles ($\phi$, $\theta$, $\psi$) satisfying: $-100°\le\theta\le-60°$, $1.193\phi-2°\le\psi\le1.193\phi+2°$; and either $\psi\le-2\phi-3°$ or $-2\phi+3°\le\psi$.

Since the piezoelectric substrate 6 made of the lithium niobate material is of a crystal of trigonal system, the Euler angles are expressed by:

$$(\phi, \theta, \psi) = (60 + \phi, -\theta, \psi)$$
$$= (60 - \phi, -\theta, 180 - \psi)$$
$$= (\phi, 180 + \theta, 180 - \psi)$$
$$= (\phi, \theta, 180 + \psi)$$

The electrodes 7 have a comb shape. The electrodes 7 are made of, for example, a single metallic substance, such as aluminum, copper, silver, gold, titanium, tungsten, molybdenum, platinum, or chrome, or their alloy or their layered structure.

The protective layer 8 is made of, for example, silicon oxide ($SiO_2$). In this case, the frequency/heat characteristics of the acoustic wave device 5 can be improved when the protective layer 8 has a thickness greater than $0.27\lambda$ and has a thermal characteristic opposite to that of the piezoelectric substrate 6. The protective layer 8 may be made of appropriate material other than silicon oxide and, when its material is properly selected, can significantly protect the electrodes 7 from ambient atmosphere.

As described, in the case that the protective layer 8 made of, for example, silicon oxide having a thickness greater than $0.27\lambda$ to improve the frequency/heat characteristics of the acoustic wave device 5, $\phi$ and $\psi$ of the Euler angles ($\phi$, $\theta$, $\psi$) of the piezoelectric substrate 6 are greater than predetermined values and change substantially along $\psi=1.193\phi$. This arrangement suppresses the generation of spurious emissions deriving from Rayleigh waves and simultaneously attenuates other spurious emissions generated about a frequency range where a fast transverse wave is produced.

Figure 2A:
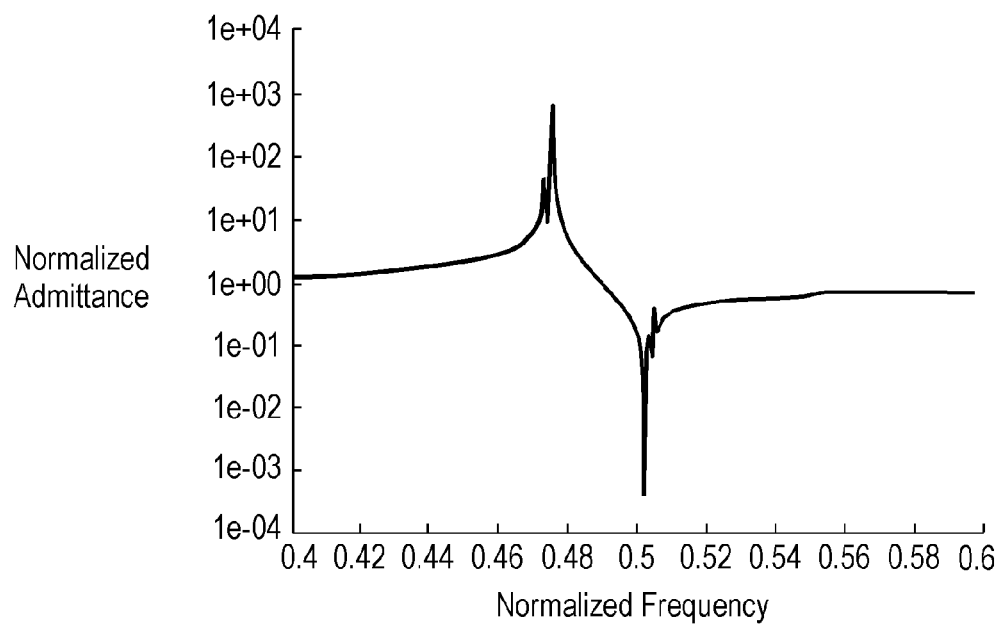
FIG. 2A is a characteristic diagram of an example of the acoustic wave device in accordance with the first embodiment of the present invention where the piezoelectric substrate is made of a lithium niobate material having the Euler angles (7°, −87.5°, 8.4°), the electrodes are made of copper with a thickness of 0.03λ, and the protective layer is made of silicon oxide with a thickness of 0.35λ and has a planar upper surface.
Figure 2B:
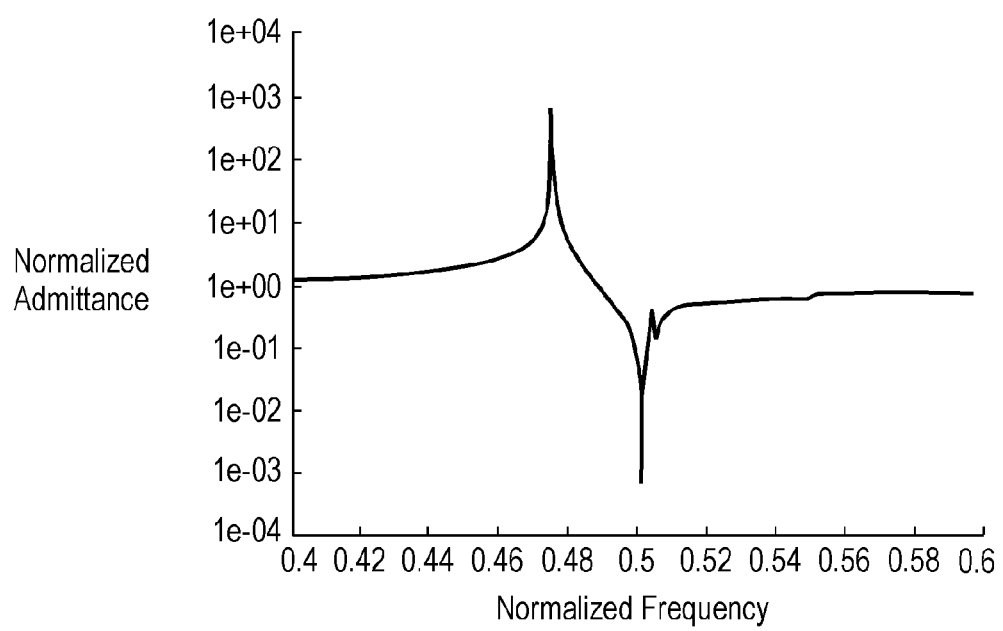
FIG. 2B is a characteristic diagram of another example of the acoustic wave device in accordance with the first embodiment of the present invention where the piezoelectric substrate is made of a lithium niobate material having the Euler angles (9°, −87.5°, 10.7°), the electrodes are made of copper with a thickness of 0.03λ, and the protective layer is made of silicon oxide with a thickness of 0.35λ and has a planar upper surface.

FIGS. 2A and 2B are characteristic diagrams of the acoustic wave device 5 where the piezoelectric substrate 6 of the acoustic wave device 5 is made of lithium niobate with the Euler angles (7°, −87.5°, 8.4°) and (9°, −87.5°, 10.7°), the electrodes 7 are made of copper with a thickness of $0.03\lambda$, and the protective layer 8 is made of silicon oxide with a thickness of $0.35\lambda$ with a planar upper surface.

As shown in FIGS. 2A and 2B, the acoustic wave device 5 of this embodiment can attenuate undesired spurious emissions on the Rayleigh wave and undesired spurious emissions in a frequency range where the fast transverse wave is produced, which are commonly generated in the conventional acoustic wave device. It is noted that the fast transverse wave is the fastest wave of transverse waves produced in the acoustic wave device 5.

Figure 3:
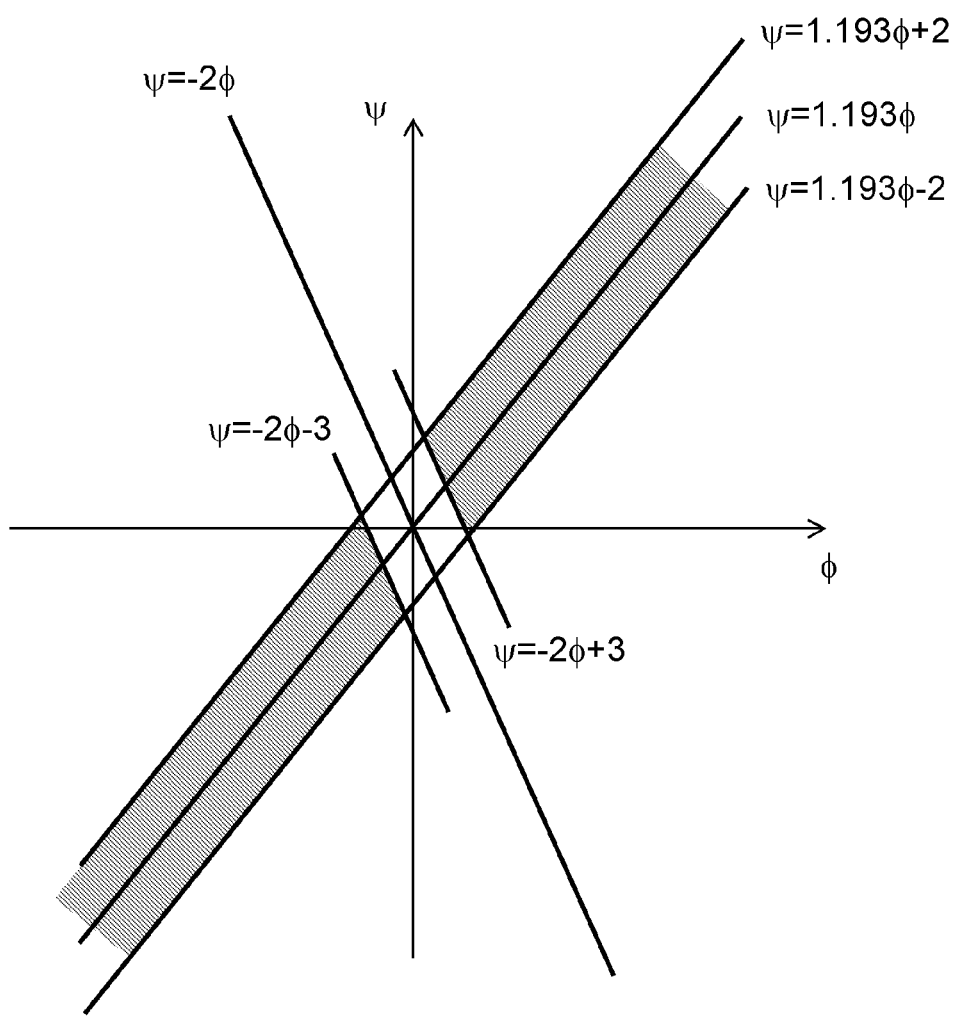
FIG. 3 is a graphic diagram of characteristics of the acoustic wave device in accordance with the first embodiment of the present invention for showing a preferable area defined by φ and ψ out of the Euler angles (φ, θ, ψ) of the piezoelectric substrate of the lithium niobate material with hatching.

FIG. 3 is a graphic diagram where preferable areas defined by $\phi$ and $\psi$ of the Euler angles ($\phi$, $\theta$, $\psi$) of the piezoelectric substrate 6 which is made of a lithium niobate material. It is also noted that $\theta$ is determined by $-100° \leq \theta \leq -60°$, the thickness of the protective layer 8 is greater than $0.27\lambda$, and the electrodes 7 are made of copper with a normalized thickness of $0.03\lambda$.

The straight line denoted by $\psi=1.193\phi$ shown in FIG. 3 represents the relationship between $\phi$ and $\psi$ when undesired spurious emissions derived from the Rayleigh wave are significantly attenuated. In the area of $\pm 2°$ about the straight line, more particularly, in the area determined by $1.193\phi-2° \leq \psi \leq 1.193\phi+2°$, the spurious emissions derived from the Rayleigh wave can be attenuated.

Figure 4:
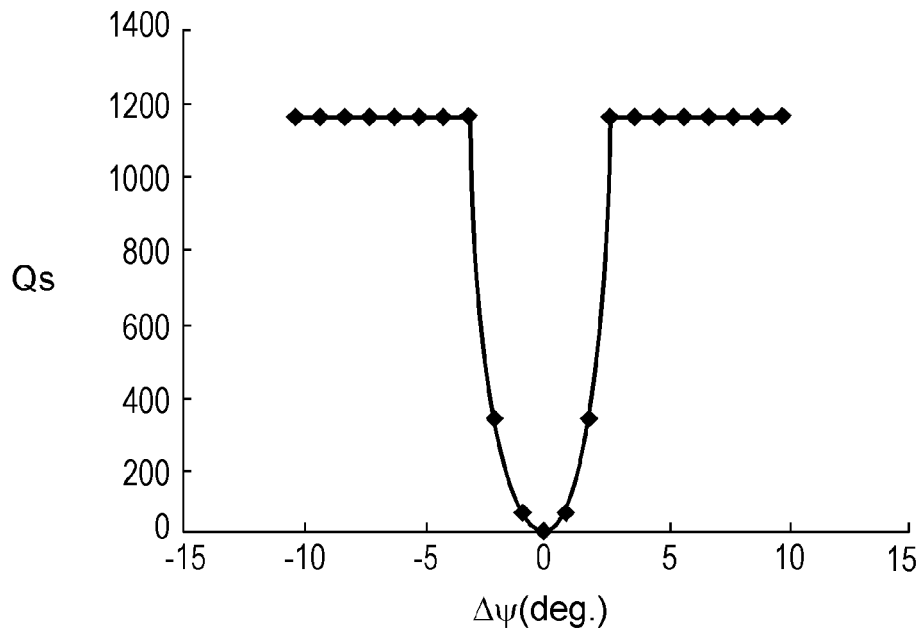
FIG. 4 is a graphic diagram of the acoustic wave device in accordance with the first embodiment of the present invention, illustrating a profile of the Q value of a Rayleigh wave in the acoustic wave device when ψ out of the Euler angles (φ, θ, ψ) of the piezoelectric substrate increases and decreases from ψ=1.193φ.

A reason for the attenuation will be described. FIG. 4 is a graphic diagram showing the Q value (Qs) of the Rayleigh wave in the acoustic wave device 5 of the first embodiment of the present invention when $\psi$ of the Euler angles ($\phi$, $\theta$, $\psi$) of the piezoelectric substrate 6 increases and decreases from $\psi=1.193\phi$. In FIG. 4, the vertical axis represents the Q value of the Rayleigh wave and the horizontal axis represents a change $\Delta\psi$ from $\psi=1.193\phi$.

As shown in FIG. 4, the Q value of the Rayleigh wave in the acoustic wave device 5 can be confined to below the predetermined level with $\psi$ of the Euler angles ($\phi$, $\theta$, $\psi$) remaining in the area of $\pm 2°$ from $\psi=1.193\phi$. Consequently, the undesired spurious emissions derived from the Rayleigh wave can be attenuated in the area defied by $1.193\phi-2° \leq \psi \leq 1.193\phi+2°$.

The straight line denoted by $\psi=-2\phi$ shown in FIG. 3 represents the relationship between $\psi$ and $\phi$ when the undesired spurious emissions generated significantly by the fast transverse wave. In the area outside by more than $\pm 3°$ about the straight line, that is the area determined by either $\psi \leq -2\phi-3°$ or $2\phi+3° \leq \psi$, the spurious emissions generated by the fast transverse wave can be attenuated.

Figure 5:
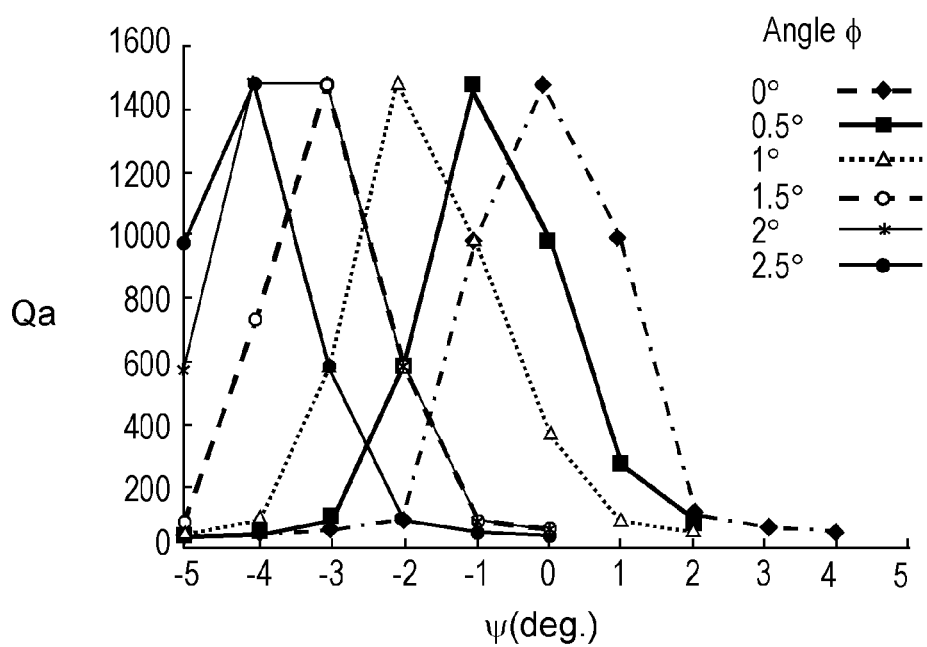
FIG. 5 is a graphic diagram of the acoustic wave device of the first embodiment of the present invention, illustrating profiles of the Q value of a Rayleigh wave of the acoustic wave device when ψ out of the Euler angles (φ, θ, ψ) of the piezoelectric substrate increases and decreases from ψ=−2φ.

A reason for the attenuation will be described. FIG. 5 is a graphic diagram showing the Q value of the Rayleigh wave in the acoustic wave device 5 of the first embodiment of the present invention when $\psi$ of the Euler angles ($\phi$, $\theta$, $\psi$) of the piezoelectric substrate 6 increases and decreases $\psi=-2\phi$. In FIG. 5, the relationship between $\psi$ and the Q value (Qa) of the fast transverse wave is shown when $\phi=0°$, $\phi=0.5°$, $\phi=1°$, $\phi=1.5°$, $\phi=2°$, and $\phi=2.5°$.

As shown in FIG. 5, the Q value of the fast transverse wave in the acoustic wave device 5 can be reduced to below the predetermined level with $\psi$ of the Euler angles ($\phi$, $\theta$, $\psi$) remaining in the area outside $\pm 3°$ from $\psi=-2\phi$. (for example, in the case that $\psi$ is greater than $+3°$ or smaller than $-3°$ for $\phi=0°$). Consequently, the desired spurious emissions generated by the fast transverse wave can be attenuated in the area determined by either $\psi \leq -2\phi-3°$ or $-2\phi+3° \leq \psi$.

FIG. 6 is a graphic diagram showing the electromechanical coupling coefficient (k2) of the Rayleigh wave in the acoustic wave device 5 of the first embodiment of the present invention when $\theta$ of the Euler angles ($\phi$, $\theta$, $\psi$) of the piezoelectric substrate 6 is varied. As shown in FIG. 6, $\theta$ of the Euler angles ($\phi$, $\theta$, $\psi$) of the piezoelectric substrate 6 satisfies $-100° \leq \theta \leq -60°$ so as to reduce the electromechanical coupling coefficient (k2) of the Rayleigh wave to smaller than 0.01.

FIG. 7 is a graphic diagram showing the normalized coupling coefficient of an SH wave in the acoustic wave device 5 of the first embodiment of the present invention when $\theta$ of the Euler angles ($\phi$, $\theta$, $\psi$) of the piezoelectric substrate 6 is varied. The normalized coupling coefficient shown in FIG. 7 is a value calculated by normalizing the electromechanical coupling coefficient by an electromechanical coupling coefficient at $\theta=-90°$. As shown in FIG. 7, the normalized coupling coefficient of the SH wave is smaller than the predetermined level (about 0.65) when $\theta$ of the Euler angles ($\phi$, $\theta$, $\psi$) of the piezoelectric substrate 6 remains in a range of $-110° \leq \theta \leq -60°$. This range includes the range of $-100° \leq \theta \leq -60°$ illustrated in FIG. 6 as described above. Consequently, the SH wave serving as a major acoustic wave can be produced efficiently while the Rayleigh wave is suppressed with $\theta$ remaining within the range of $-100° \leq \theta \leq -60°$.

Figure 8:
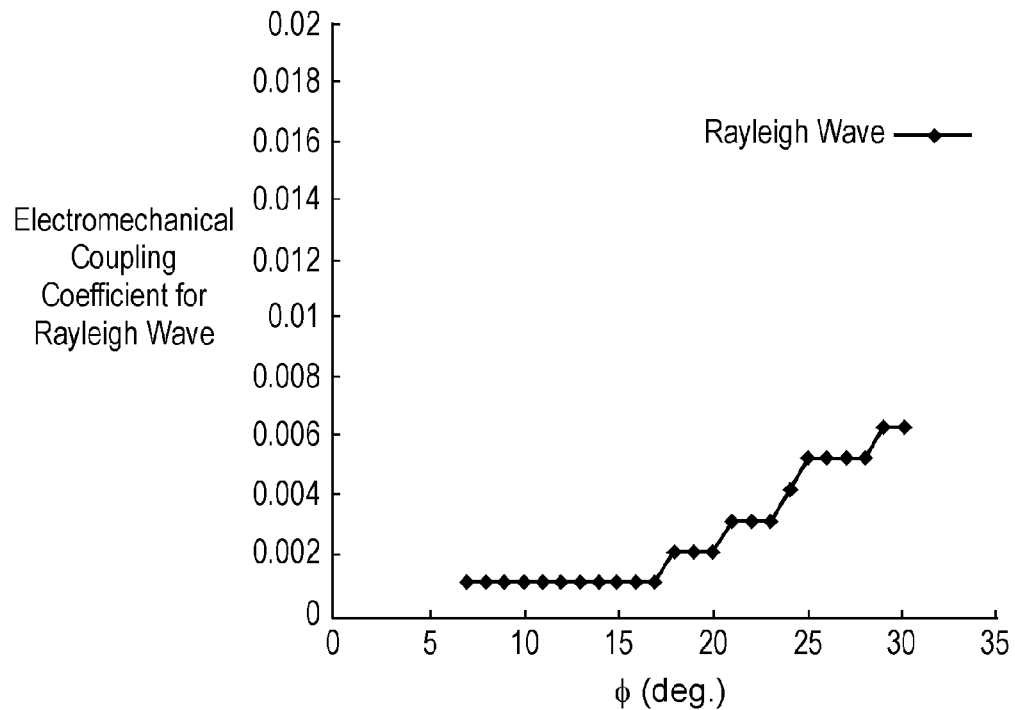
FIG. 8 is a graphic diagram of the acoustic wave device in accordance with the first embodiment of the present invention, illustrating a variation profile of the electromechanical coupling coefficient of a Rayleigh wave with relation to φ of the acoustic wave device when φ and ψ of the Euler angles (φ, θ, ψ) of the piezoelectric substrate changes along ψ=1.193φ.

FIG. 8 is a graphic diagram showing a variation of the electromechanical coupling coefficient (k2) of the Rayleigh wave in relation to $\phi$ of the acoustic wave device 5 of the first embodiment of the present invention when $\phi$ and $\psi$ of the Euler angles ($\phi$, $\theta$, $\psi$) of the piezoelectric substrate 6 change along $\psi=1.193\phi$. As shown in FIG. 8, the electromechanical coupling coefficient of the Rayleigh wave can be decreased to smaller than 0.002 which is much smaller than 0.01 described above when $\phi \leq 20°$. This is similarly established when the Euler angles of the piezoelectric substrate 6 change in the negative direction in relation to $\phi$. Consequently, $\phi$ out of the Euler angles ($\phi$, $\theta$, $\psi$) of the piezoelectric substrate 6 in the acoustic wave device 5 preferably satisfies a condition, $|\phi| \leq 20°$. The electromechanical coupling coefficient of the Rayleigh wave can further be decreased by satisfying this condition.

Figure 9:
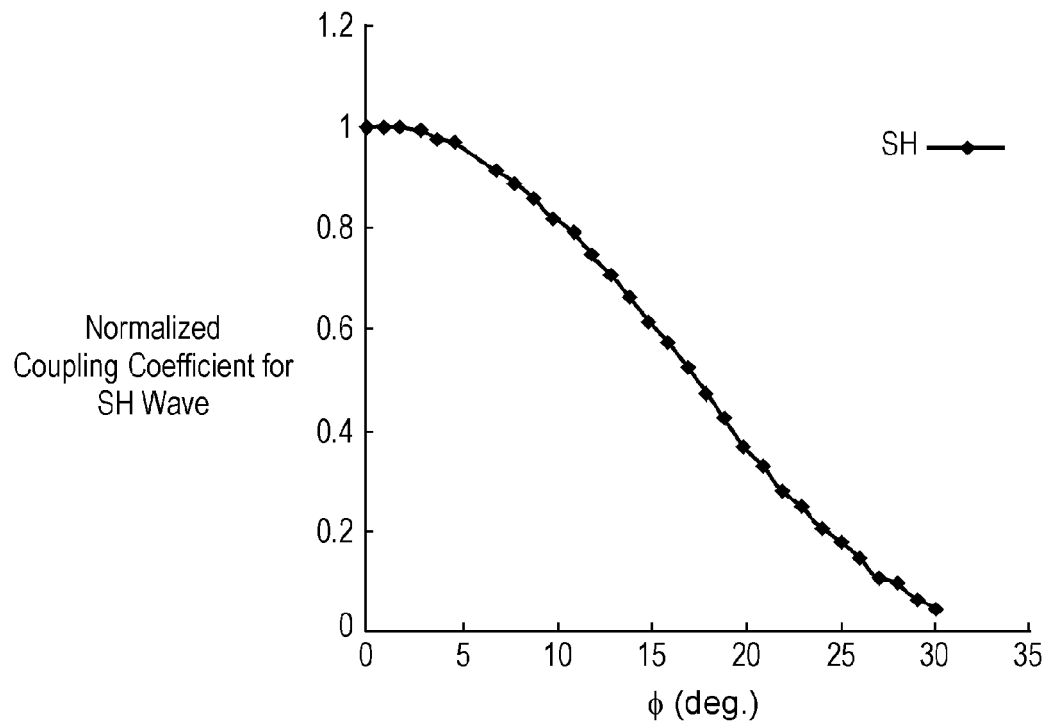
FIG. 9 is a graphic diagram of the acoustic wave device in accordance with the first embodiment of the present invention, illustrating a variation profile of the normalized coupling coefficient of the SH wave with relation to φ in the acoustic wave device when φ and ψ of the Euler angles (φ, θ, ψ) of the piezoelectric substrate changes along ψ=1.193φ.

FIG. 9 is a graphic diagram showing a variation in relation to $\phi$ of the normalized coupling coefficient of the SH wave in the acoustic wave device 5 of the first embodiment of the present invention when $\phi$ and $\psi$ of the Euler angles ($\phi$, $\theta$, $\psi$) of the piezoelectric substrate 6 are shifted along $\psi = 1.193\phi$. While FIG. 9 illustrates the Euler angles of the piezoelectric substrate 6 change in the positive direction, the change in relation to $\phi$ in the negative direction of the Euler angles in the piezoelectric substrate 6 provides the same effect. More specifically, as shown in FIG. 9, the output of the SH wave as a major acoustic wave increases when $\phi$ decreases. From this point of view, the embodiment is practical since the electromechanical coupling coefficient of the SH wave remains smaller than the predetermined level when $\phi$ of the Euler angles ($\phi$, $\theta$, $\psi$) of the piezoelectric substrate 6 satisfies $|\phi| \leq 20°$.

Second Exemplary Embodiment

Another acoustic wave device 15 according to the second embodiment of the present invention will be described referring to the relevant drawings. It is noted that the arrangement of the acoustic wave device 15 is identical to that of the acoustic wave device 5 of the first embodiment unless otherwise explained.

Figure 10:
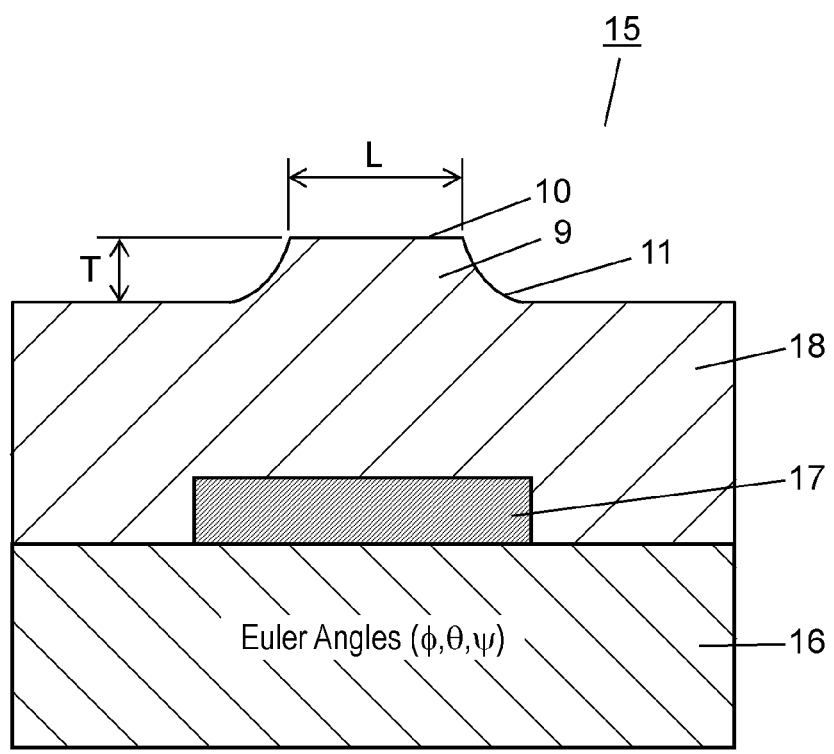
FIG. 10 is a schematic cross sectional view of an acoustic wave device in accordance with a second exemplary embodiment of the present invention.

FIG. 10 is a schematic cross sectional view of the acoustic wave device 15 of the second embodiment of the present invention. The acoustic wave device 15 of this embodiment includes a piezoelectric substrate 16, electrodes 17, and a protective layer 18. The piezoelectric substrate 16 is made of a lithium niobate material having the Euler angles ($\phi$, $\theta$, $\psi$). The electrodes 17 are disposed on the piezoelectric substrate 16 to excite a major acoustic wave of a wavelength $\lambda$. The protective layer 18 is disposed on the piezoelectric substrate 16 so as to cover the electrodes 17 and has a thickness greater than $0.2\lambda$. The protective layer 18 has a projection 9 which is aligned substantially with above each electrode finger of the electrodes 17 in the cross section taken along a direction orthogonal to the direction in which the electrode fingers of the electrodes 17 extend. The top 10 of the projection 9 has a width smaller than the width of each electrode finger of the electrodes 17.

The Euler angles of the piezoelectric substrate 16 satisfy $-100° \leq \theta \leq -60°$ and $1.193\phi - 2° \leq \psi \leq 1.193\phi + 2°$ and in addition either $\psi \leq -2\phi - 3°$ or $-2\phi + 3° \leq \psi$.

In the case that the protective layer 18 has the projections, the generation of undesired spurious emissions by the fast transverse wave may become a problem. In this embodiment, the thickness of the protective layer 18 made of, for example, silicon oxide is smaller than $0.2\lambda$ for improving the frequency/heat characteristics of the acoustic wave device 15. In this case, $\phi$ and $\psi$ out of the Euler angles ($\phi$, $\theta$, $\psi$) of the piezoelectric substrate 16 are greater than the predetermined values and change substantially along $\psi = 1.193\phi$. Consequently, undesired spurious emissions generated at a frequency range where the fast transverse wave is produced can be attenuated, and undesired spurious emissions derived from the Rayleigh wave are attenuated.

Figure 11A:
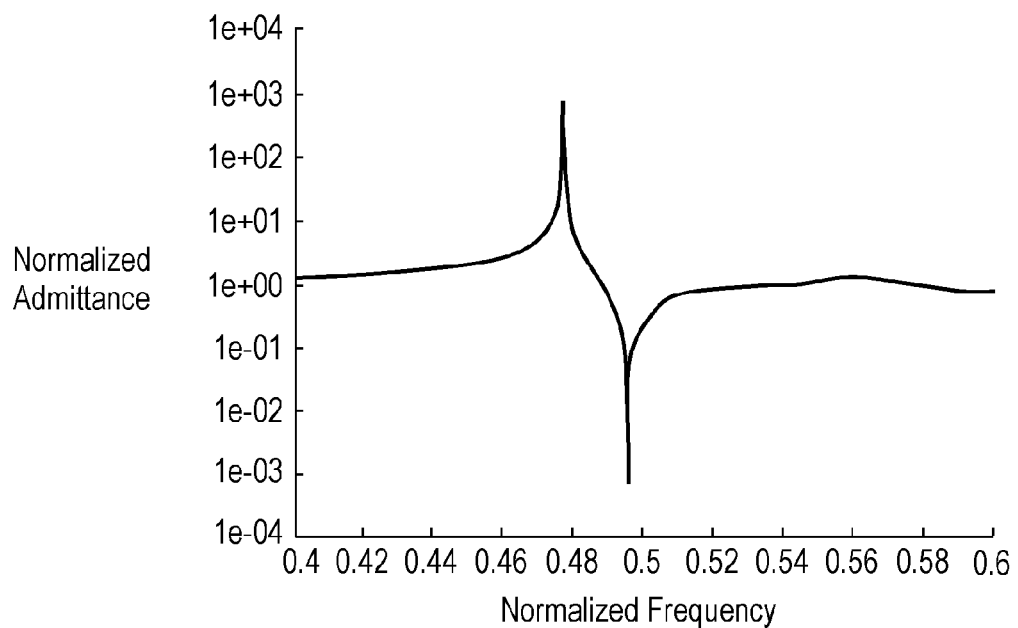
FIG. 11A is a characteristic diagram of the acoustic wave device in accordance with the second embodiment of the present invention.
Figure 11B:
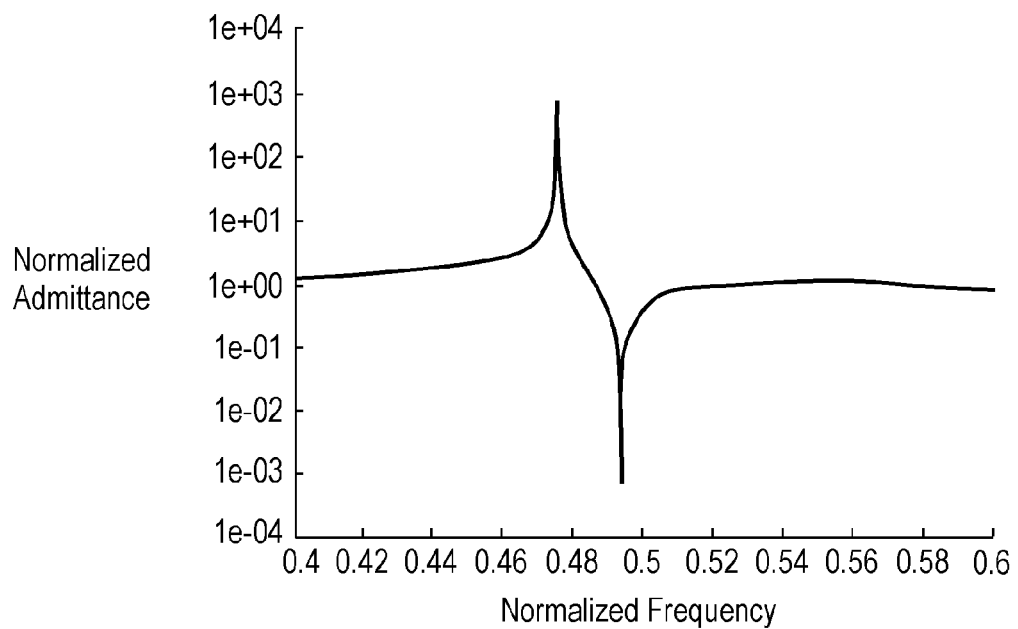
FIG. 11B is a characteristic diagram of the acoustic wave device of the second embodiment of the present invention.

FIGS. 11A and 11B are characteristic graphs of the acoustic wave device 15 of the second embodiment of the present invention. In the acoustic wave device 15, the piezoelectric substrate 16 is made of lithium niobate having the Euler angles (7°, −87.5°, 8.4°) and (9°−87.5°, 10.7° the electrodes 17 are made of aluminum having a thickness of $0.08\lambda$, and the protective layer 18 is made of silicon oxide with a thickness of $0.35\lambda$ and has projections 9 formed on the upper surface thereof with a height T=0.08?.

As shown in FIGS. 11A and 11B, the acoustic wave device 15 of this embodiment can suppress the generation of undesired spurious emissions in a frequency range where the fast transverse wave is produced while undesired spurious emissions derived from the Rayleigh wave are attenuated.

Each projection 9 of the protective layer 18 preferably has a shape having each curved side thereof projecting downwardly while each side extending from the top 10 to the bottom 11. As shown in FIG. 10, the width L of the top 10 is determined between two points where the downwardly-projecting sides or their extending lines intersect the straight line parallel to the upper surface at the top 10 of the piezoelectric substrate 16.

As determined in that manner, the width L of the top 10 is smaller than the width of each electrode finger of the electrodes 17. This arrangement allows the mass of the protective layer 18 to vary at the projections 9 continuously and moderately. As the result, the electrical characteristics of the acoustic wave device 15 can be improved while the generation of undesired reflection caused by the shape of the protective layer 18 is suppressed.

The width L at the top 10 of the projection 9 is preferably smaller than ½ the width of each electrode finger of the electrodes 17. The center of the top 10 may be preferably positioned directly above the center of the electrode finger. This increases the rate of reflection at the electrode fingers due to the effect of the addition of mass, hence improving the electrical characteristics of the acoustic wave device 15.

Moreover, the height T of the projection 9 and the thickness h of the electrode 17 may preferably satisfy $0.03\lambda < T \leq h$. As for the relationship between the electrical characteristics and the height T of the projection 9 of the protective layer 18 extending from the bottom 11 to the top 10, the rate of reflection increases significantly when the height T is greater than $0.03\lambda$ from the upper surface of the protective layer 18 which is a planar surface. If the height T of the projection 9 is greater than the thickness h of the electrode 17, processes of production, which will be described later, has to be increased by more steps for depositing the protective layer 8 and will be troublesome. It is hence desired that the relation of $0.03\lambda < T \leq h$ is satisfied.

Processes of producing the acoustic wave device 15 of the second embodiment of the present invention will be described below.

FIGS. 12A to 12H are views of the acoustic wave device 15 with the projections 9 of the second embodiment of the present invention for showing processes for producing the acoustic wave device 15.

Figure 12A:
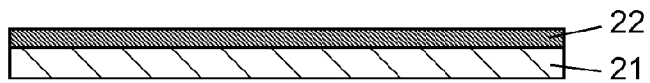
FIG. 12A is an explanatory view of an acoustic wave device with projections in accordance with the second embodiment of the present invention for illustrating a method of manufacturing the acoustic wave device.

As shown in FIG. 12A, an electrode layer 22 which turns to at least either electrodes or reflectors is formed on the upper side of a piezoelectric substrate 21 by vapor deposition or sputtering of a material Al or its alloy.

Figure 12B:
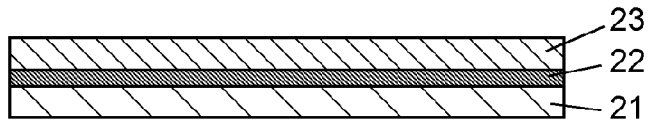
FIG. 12B is an explanatory view of the acoustic wave device with eth projections in accordance with the second embodiment of the present invention for illustrating the method of manufacturing the acoustic wave device.

As shown in FIG. 12B, a resist layer 23 is then developed on the upper side of the electrode pattern 22.

Figure 12C:
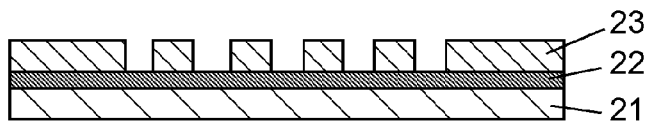
FIG. 12C is an explanatory view of the acoustic wave device with eth projections in accordance with the second embodiment of the present invention for illustrating the method of manufacturing the acoustic wave device.

As shown in FIG. 12C, the resist layer 23 is processed to have a predetermined shape by exposure and development technique.

Figure 12D:
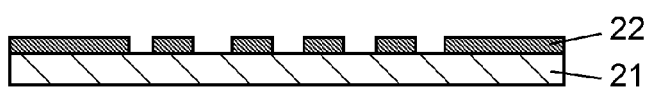
FIG. 12D is an explanatory view of the acoustic wave device with eth projections in accordance with the second embodiment of the present invention for illustrating the method of manufacturing the acoustic wave device.

As shown in FIG. 12D, the electrode layer 22 is processed by dry etching or any other appropriate technique to form a desired pattern of IDT electrodes or reflectors, and then, the resist layer 23 is removed.

Figure 12E:
FIG. 12E is an explanatory view of the acoustic wave device with eth projections in accordance with the second embodiment of the present invention for illustrating the method of manufacturing the acoustic wave device.

As shown in FIG. 12E, the electrode layer 22 is then covered by vapor deposition or sputtering of silicon oxide to form a protective layer 24. It is desired in this step for having the protective layer 24 provided with the prescribed projections 9 to employ a so-called bias sputtering technique where the sputtering is carried out with the piezoelectric substrate 21 being applied with a bias voltage.

By the bias sputtering technique, while the protective layer 24 is deposited on the piezoelectric substrate 21 by sputtering the target material of silicon oxide, a bias voltage is applied to sputter portions of the protective layer 24 on the piezoelectric substrate 21. More specifically, the protective layer 24 is partially shaved while being deposited to control the development of the protective layer 24 for making a desired shape.

Controlling the shape of the protective layer 24 may involve varying the ratio between the sputtering power and the bias voltage to be applied to the piezoelectric substrate 21 during the sputtering, or depositing the layer 24 with no bias voltage applied to the piezoelectric substrate 21 at the beginning of the sputtering and then at the following stage applying a bias voltage to the piezoelectric substrate 21 while depositing the layer. With this means, the temperature of the piezoelectric substrate 21 is controlled properly.

Figure 12F:
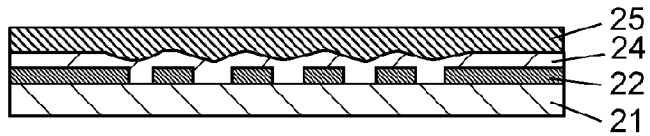
FIG. 12F is an explanatory view of the acoustic wave device with eth projections in accordance with the second embodiment of the present invention for illustrating the method of manufacturing the acoustic wave device.

As shown in FIG. 12F, a resist layer 25 is then formed on the protective layer 24.

Figure 12G:
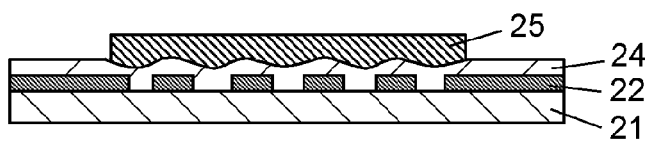
FIG. 12G is an explanatory view of the acoustic wave device with eth projections in accordance with the second embodiment of the present invention for illustrating the method of manufacturing the acoustic wave device.

As shown in FIG. 12G, the resist layer 25 is processed by exposure and development technique to have a desired shape.

Figure 12H:
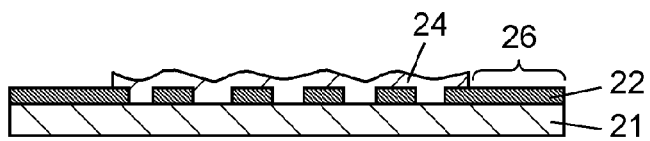
FIG. 12H is an explanatory view of the acoustic wave device with eth projections in accordance with the second embodiment of the present invention for illustrating the method of manufacturing the acoustic wave device.

As shown in FIG. 12H, unwanted regions of the protective layer 24 are removed by dry etching or any other appropriate technique for making, for example, pads 26 for outputting electrical signals, and then, the resist layer 25 is completely removed.

Finally, the finished structure is separated by dicing to obtain the acoustic wave devices 15.

As described above, the bias sputtering technique can deposit the protective layer 24 under a favorable layer depositing condition thus to provide the projections 9 with a predetermined shape.

The characteristics of the acoustic wave device 15 of this embodiment are equal to those of the acoustic wave device 5 of the first embodiment shown in FIGS. 3 to 9. More particularly, even if the protective layer 18 made of silicon oxide has a thickness of greater than, for example, $0.2\lambda$ for improving the frequency/heat characteristic of the acoustic wave device 15, undesired spurious emissions generated in a frequency range where the fast transverse waves appear can be attenuated, and simultaneously, the generation of undesired spurious emissions derived from the Rayleigh wave can be suppressed by causing $\phi$ and $\psi$ out of the Euler angles ($\phi, \theta, \psi$) of the piezoelectric substrate 6 to be greater than predetermined values and to change substantially along $\psi=1.193\phi$.

Figure 13:
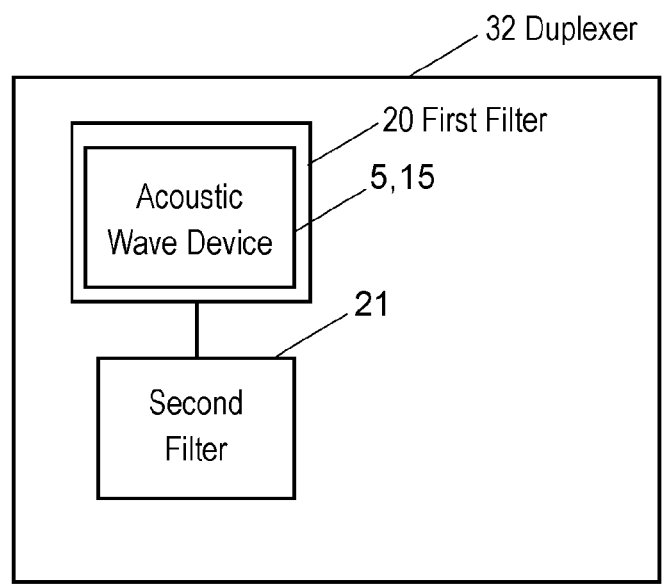
FIG. 13 is a view of an arrangement of a duplexer according to one embodiment of the present invention.

As shown in FIG. 13, the acoustic wave devices 5 and 15 according to the first and second embodiments is preferably used as a first filter 20 installed in a duplexer 32 which includes the first filter 20 and a second filter 21 which has a higher passing frequency range than the first filer 20. FIG. 13 is a diagram showing an arrangement of the duplexer 32 in accordance with embodiments of the present invention. More particularly, although undesired spurious emissions generated by the fast transverse wave in the first filter 20 tend to deteriorate the passing quality of the second filter 21, the acoustic wave devices 5 and 15 as the first filer 20 can protect the passing quality of the second filter 31 from being disturbed.

The acoustic wave devices 5 and 15 of the first and second embodiments may be employed as resonators (not shown) or other types of filter (not shown) including ladder filters and DMS filters.

Figure 14:
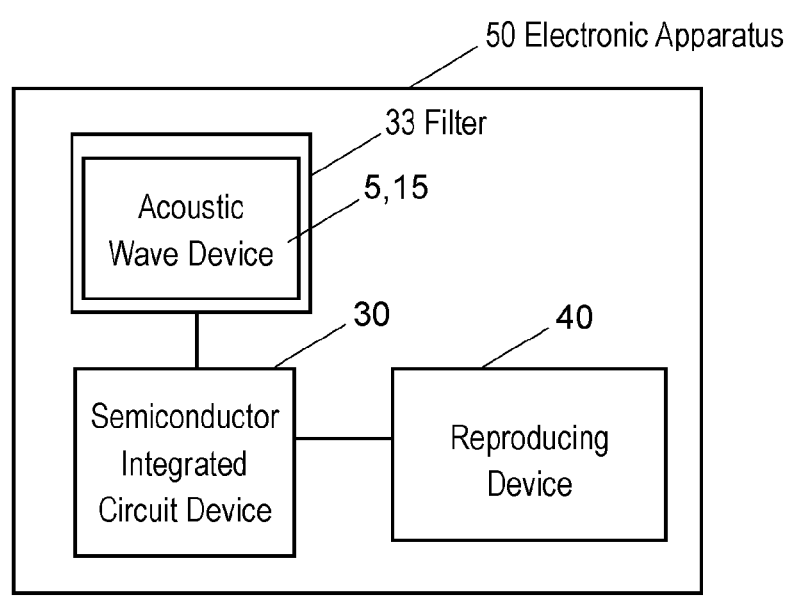
FIG. 14 is a schematic view of an electronic apparatus according to the embodiments of the present invention.

Moreover, as shown in FIG. 14, an electronic apparatus 50 may include a filter 33 to which any of the acoustic wave devices 5, 15 is applied, a semiconductor integrated circuit device 30 connected to the filter 33, and a reproducing device 40 connected to the semiconductor integrated circuit device 30. FIG. 14 is a diagram of the electronic apparatus 50 in accordance with an embodiment of the present invention. The resonator, the filter, and the electronic apparatus can be improved in communication quality.

Third Exemplary Embodiment

An acoustic wave device 45 according to a third exemplary embodiment of the present invention will be described referring to the relevant drawings. It is noted that the arrangement of the acoustic wave device 45 is identical to that of the acoustic wave devices 5 and 15 of the first and second embodiments unless otherwise explained.

Figure 15:
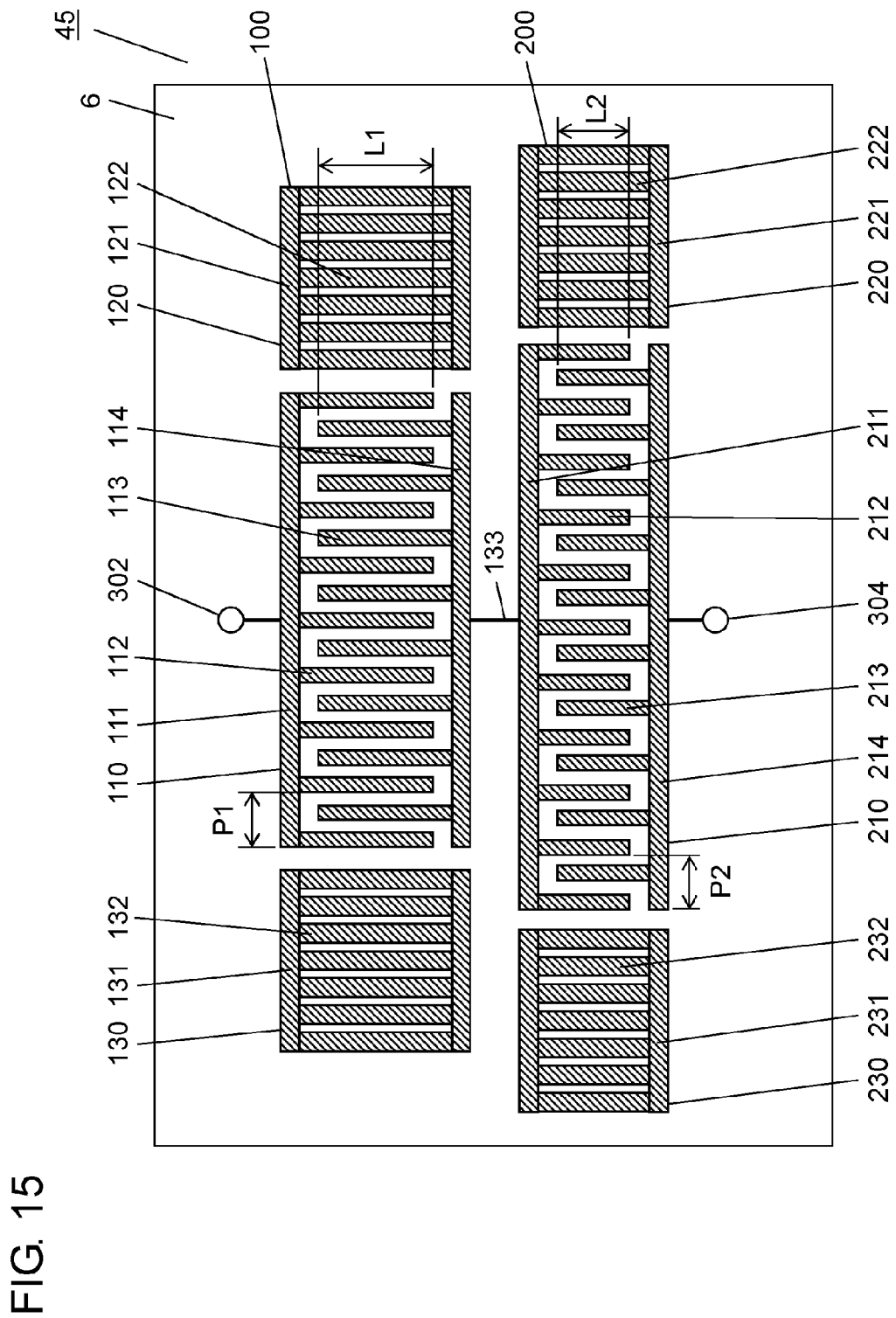
FIG. 15 is a top view of an acoustic wave device according to a third exemplary embodiment of the present invention.

FIG. 15 is a top view of the acoustic wave device 45 according to the third embodiment of the present invention. The acoustic wave device 45 includes, as shown in FIG. 15, a piezoelectric substrate 6 having the Euler angles described in the first embodiment, a first acoustic wave resonator 100 mounted on an upper surface of the piezoelectric substrate 6, and a second acoustic wave resonator 200 mounted on the upper surface of the piezoelectric substrate 6. The first acoustic wave resonator 100 and the second acoustic wave resonator 200 are connected to each other in series.

The first acoustic wave resonator 100 includes interdigital transducer electrode 110 and grating reflectors 120 and 130. The grating reflectors 120 and 130 are located sandwiching the interdigital transducer electrode 110 between reflectors 120 and 130 on an acoustic wave propagating path.

The interdigital transducer electrode 110 includes a bus bar 111 and plural comb-shaped electrodes 112 connected electrically to the bus bar 111. The comb-shaped electrodes 112 have equal lengths. The comb-shaped electrodes 112 are arranged at equal periods of P1 and joined to the bus bar 111. The interdigital transducer electrode 110 further includes plural comb-shaped electrodes 113 connected electrically to a bus bar 114. The comb-shaped electrodes 113 have equal lengths. The comb-shaped electrodes 113 are arranged at equal periods of P1 and joined to the bus bar 114. The comb-shaped electrodes 112 and the comb-shaped electrodes 113 are arranged alternately and interdigitate with each other with interdigitating width L1 (throughout which adjacent comb-shaped electrodes interdigitate with each other). The bus bar 111 is electrically connected to an input terminal 302.

The grating reflector 120 includes comb-shaped electrodes 122 connected electrically to a bus bar 121. The comb-shaped electrodes 122 are arranged at equal periods of P1/2 and joined to the bus bar 121. The grating reflector 130 includes comb-shaped electrodes 132 connected electrically to a bus bar 131. The comb-shaped electrodes 132 are arranged at equal periods of P1/2 and joined to the bus bar 131.

The second acoustic wave resonator 200 includes interdigital transducer electrodes 210 and grating reflectors 220 and 230. The grating reflectors 220 and 230 are located to sandwich the interdigital transducer electrodes 210 between reflectors 220 and 230 on an acoustic wave propagating path.

The interdigital transducer electrode 210 includes plural comb-shaped electrodes 212 connected electrically to a bus bar 211. The comb-shaped electrodes 212 are arranged at equal periods of P2 and joined to the bus bar 211. The interdigital transducer electrode 210 further includes plural comb-shaped electrodes 213 connected electrically to a bus bar 214. The comb-shaped electrodes 213 are arranged at equal periods of P2 and joined to the bus bar 214. The comb-shaped electrodes 212 and the comb-shaped electrodes 213 are arranged alternately and interdigitate with each other with an interdigitating width L2. The interdigitating width L2 of the comb-shaped electrodes 212 and the comb-shaped electrodes 213 is smaller than the interdigitating width L1 of the first acoustic wave resonator 100. The bus bar 214 is electrically connected to an output terminal 304.

The grating reflector 220 includes comb-shaped electrodes 222 connected electrically to a bus bar 221. The comb-shaped electrodes 222 are arranged at equal periods of P2/2 and joined to the bus bar 221. The grating reflector 230 includes comb-shaped electrodes 232 connected electrically to a bus bar 231. The comb-shaped electrodes 232 are arranged at equal periods P2/2 and joined to the bus bar 231.

The first acoustic wave resonator 100 and the second acoustic wave resonator 200 are electrically connected to each other by a connecting line 133, hence forming a longitudinal connection. Alternatively, the bus bar 114 and the bus bar 211 may be connected directly to each other without the connecting line 133. In this case, the acoustic wave device can be downsized with no use of the connecting line 133.

Since the interdigitating width L1 of the comb-shaped electrodes 112 and 113 of the interdigital transducer electrode 110 of the first acoustic wave resonator 100 is different from the interdigitating width distance L2 of the comb-shaped electrodes 212 and 213 of the interdigital transducer electrode 210 of the second acoustic wave resonator 200. This structure provides the following effects.

A cause of deteriorating the performance of the acoustic wave resonator which is disposed on the piezoelectric substrate 6 made of lithium niobate is the generation of transverse mode spurious emissions. The transverse mode spurious emissions are spurious emissions which are generated in the passing frequency range due to a standing wave occurring in a direction perpendicular to a propagating direction in which the acoustic wave propagates. In the case that the first acoustic wave resonator 100 and the second acoustic wave resonator 200 has the same interdigitating widths, transverse mode spurious emissions of the resonators 100 and 200 match in the generating frequency. This results in signal loss due to the serious spurious emissions generated in the passing frequency range.

Further, when the acoustic coupling between the first acoustic wave resonator 100 and the second acoustic wave resonator 200 is not adequate, the transverse mode spurious emissions perfectly match in the generating frequency, hence increasing the signal loss.

However, the generation of transverse mode spurious emissions can be separated into different frequency ranges between the first acoustic wave resonator 100 and the second acoustic wave resonator 200 by differentiating the interdigitating widths L1 and L2 from each other.

More particularly, if the interdigitating width changes from one acoustic wave resonator to the other, the generation of undesired spurious emissions can effectively be shifted into different ranges of the generating frequency. This provides the acoustic wave device with less effect of the spurious emissions and minimum of the signal loss. Also, as compared to an arrangement with apodization, the wave propagating path of each acoustic wave resonator remains not disturbed by dummy electrodes, thus preventing the declination of a Q value. Consequently the acoustic wave device can be improved in the characteristics having less signal loss in the passing frequency range.

Moreover, the number N1 of pairs of the first acoustic wave resonator 100 and the number N2 of pairs of the second acoustic wave resonator 200 may preferably satisfy N1<N2. More specifically, the number N1 of pairs of the comb-shaped electrodes 112 and 113 of the first acoustic wave resonator 100 is preferably smaller than the number N2 of pairs of the comb-shaped electrodes 212 and 213 of the second acoustic wave resonator 200.

The capacitance C1 of the first acoustic wave resonator 100 is proportional to the product of the number N1 of pairs and the interdigitating width L1. Similarly, the capacitance C2 of the second acoustic wave resonator 200 is proportional to the product of the number N2 of pairs and the interdigitating width L2. Accordingly, in the case that the number N1 of the first acoustic wave resonator 100 is equal to the number N2 of the second acoustic wave resonator 200, the relation of L1>L2 provides the relation of C1>C2.

A voltage applied to the second acoustic wave resonator 200 is inverse proportional to the ratio C2/C1 of the first acoustic wave resonator 100 and the second acoustic wave resonator 200. Therefore, the voltage to be applied to the second acoustic wave resonator 200 under the condition of C1>C2 becomes higher than the voltage applied to the first acoustic wave resonator 100, hence decreasing the resistance to electrical power. In the case that the relation of N1<N2 is satisfied, the ratio of the capacitance C1 to the capacitance C2 is eased so that voltages applied to the comb-shaped electrodes 213 of the interdigital transducer electrode 210 of the second acoustic wave resonator 200 can be lowered, hence increasing the resistance to electrical power.

The relation of C1>C2 is preferably satisfied. Even if the acoustic wave resonators are equal in the capacitance, an acoustic wave resonator having a longer interdigitating width and a smaller number of pairs has less resistance to electrical power due to a resistive loss of the comb-shaped electrodes than another acoustic wave resonator having a shorter interdigitating width and a larger number of pairs. For compensation, the relation of capacitances, C1>C2 is employed for determining the conditional setting of the numbers N1 and N2, thereby allowing the voltage applied to each resonator to be controlled and improving the resistance to electrical power.

In addition, if the pitch P1 of the first acoustic wave resonator 100 and the pitch P2 of the second acoustic wave resonator 200 are equal to each other so as to match the resonance frequency of the acoustic wave resonators, the signal loss can be minimized. Contrary, the pitches P1 and P2 are different from each other to broaden the passing frequency range and the band elimination frequency range, thus enhancing the freedom of designing.

The acoustic wave device of this embodiment is explained with the first acoustic wave resonator 100 and the second acoustic wave resonator 200 connected in series in two stages. The acoustic wave resonators maybe connected in series in three stages, hence providing the same effect.

Fourth Exemplary Embodiment

An acoustic wave device 35 according to a fourth embodiment of the present invention will be described referring to the relevant drawings. The arrangement of the acoustic wave device 35 is identical to that of the acoustic wave devices 5 and 15 of the first and second embodiments unless otherwise explained.

The acoustic wave device 35 of this embodiment includes a piezoelectric substrate 6 having the Euler angles described in the first embodiment.

Figure 16:
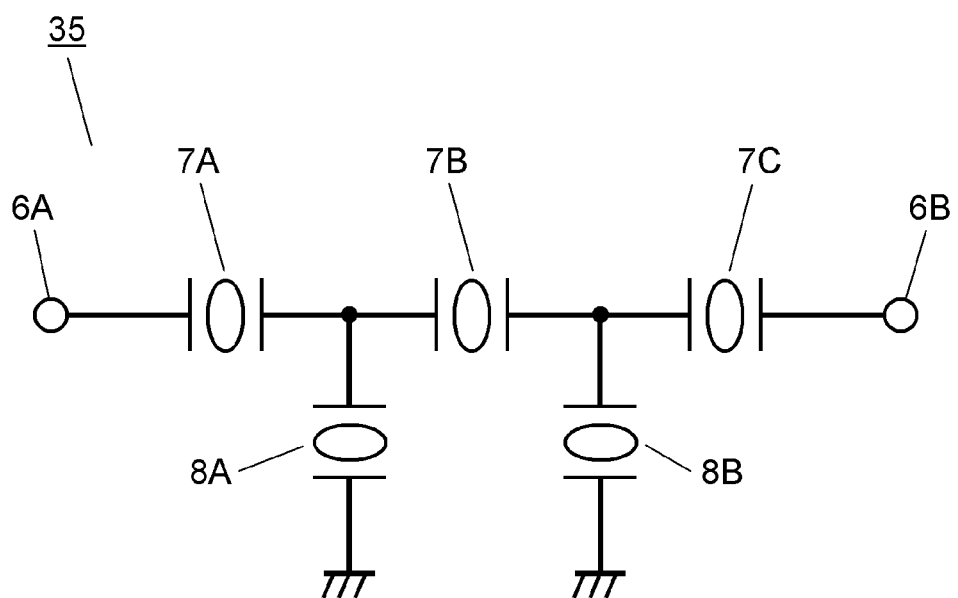
FIG. 16 is a circuit diagram of an acoustic wave device according to a fourth exemplary embodiment of the present invention.

As shown in FIG. 16, the acoustic wave device 35 of this embodiment includes series resonators 7A, 7B, and 7C connected electrically in series between input and output terminals 6A and 6B. The acoustic wave device 35 further includes a parallel resonator 8A connected at one end between the series resonators 7A and 7B and at the other end to a ground, and more specifically, connected in parallel to the input terminal 6A and the output terminal 6B. The acoustic wave device 35 further includes a parallel resonator 8B which is connected at one end between the series resonators 7B, 7C and at the other end to the ground, and more specifically, connected in parallel to the input terminal 6A and the output terminal 6B.

Figure 17:
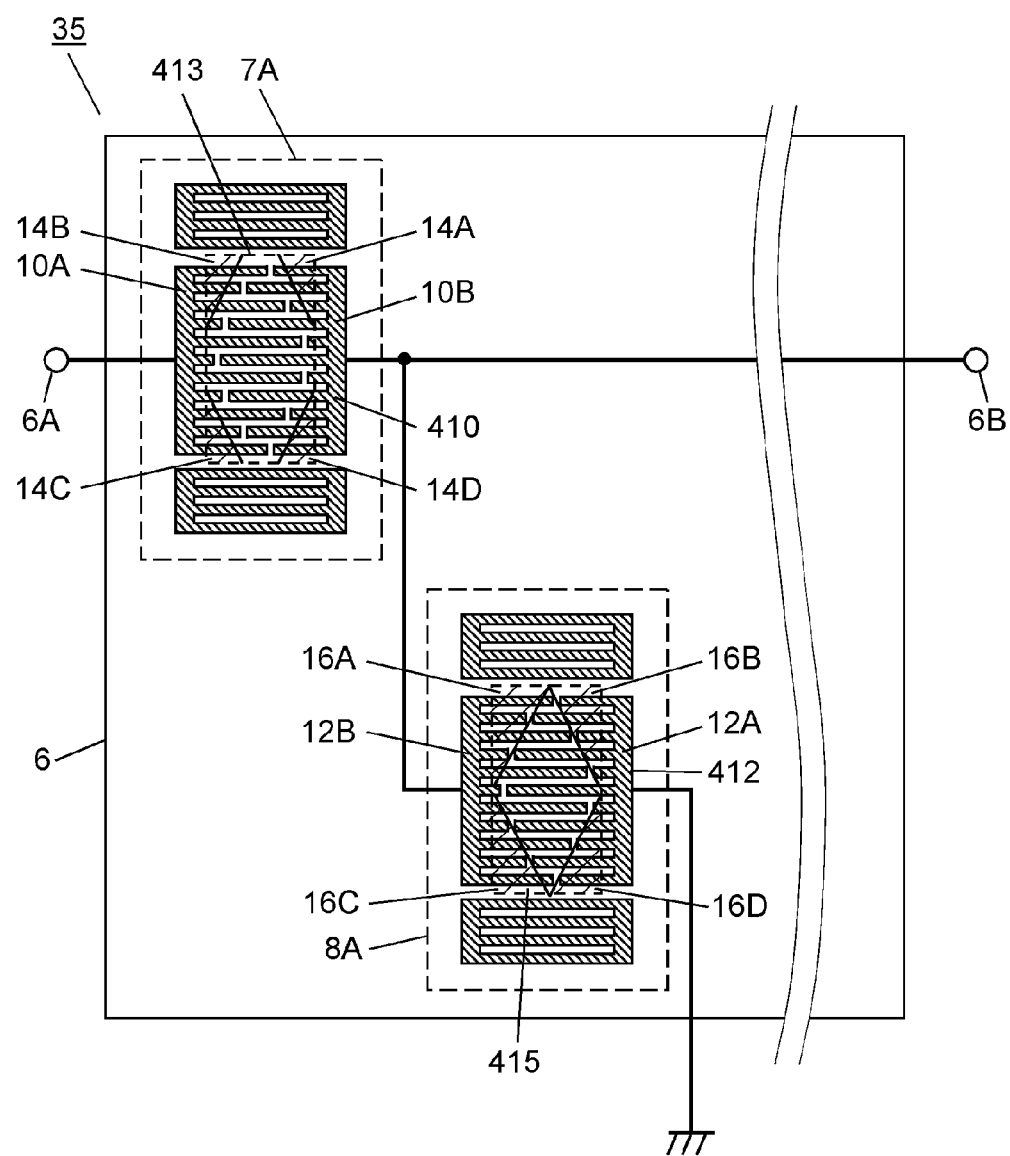
FIG. 17 is a circuit diagram of the acoustic wave device in accordance with the fourth embodiment of the present invention.
Figure 18:
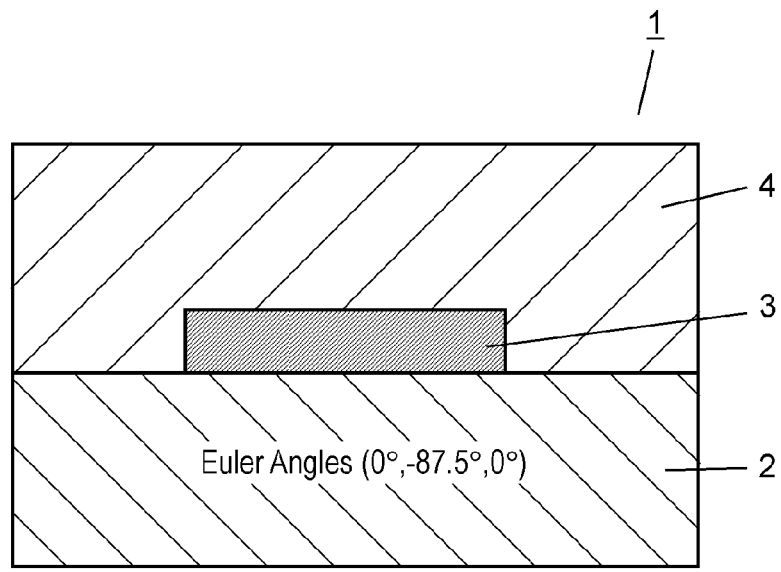
FIG. 18 is a schematic cross sectional view of a conventional acoustic wave device.
Figure 19:
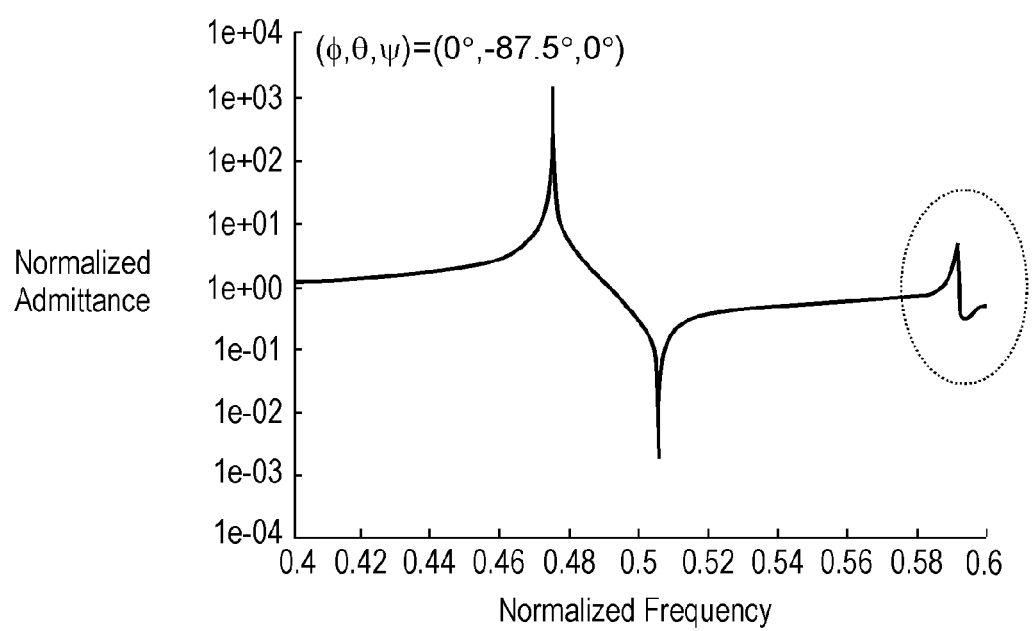
FIG. 19 is a characteristic diagram of an example of the conventional acoustic wave device where the piezoelectric substrate is made of a lithium niobate material having the Euler angles (0°, −87.5°, 0°), the electrodes are made of copper with a thickness of $0.03\lambda$, and the protective layer is made of silicon oxide with a thickness of 0.35° and has a planar upper surface.
Figure 20:
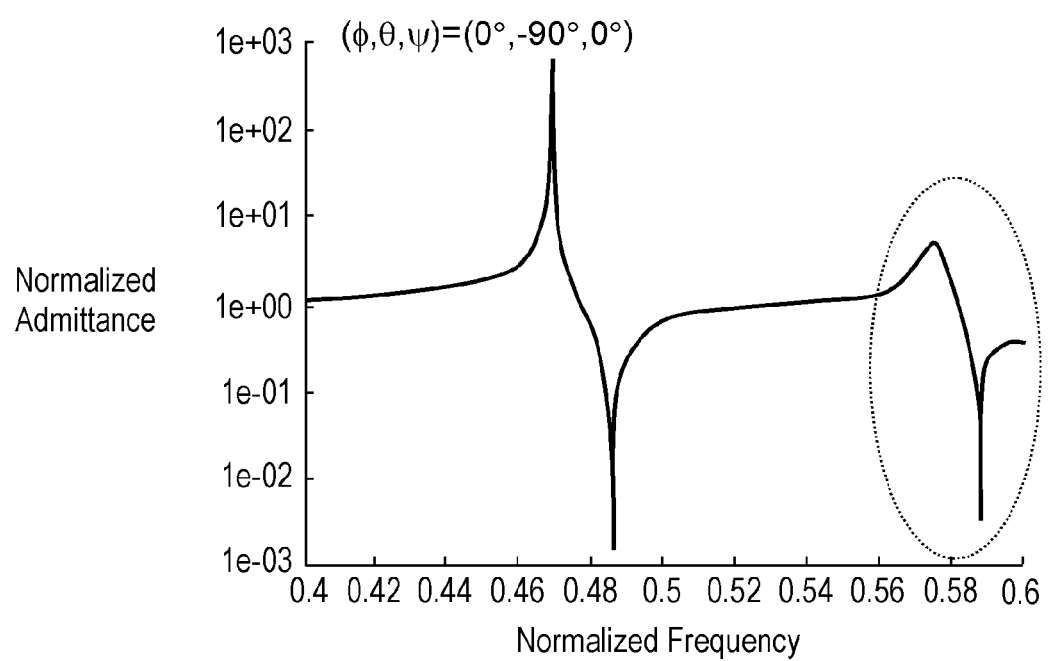
FIG. 20 is a characteristic diagram of another example of the conventional acoustic wave device where the piezoelectric substrate is made of a lithium niobate material having the Euler angles (0°, −90°, 0°), the electrodes are made of aluminum with a thickness of $0.08\lambda$, and the protective layer is made of silicon oxide with a thickness of $0.35\lambda$ and has a projection on the upper surface above each electrode finger of the electrodes.
Figure 21A:
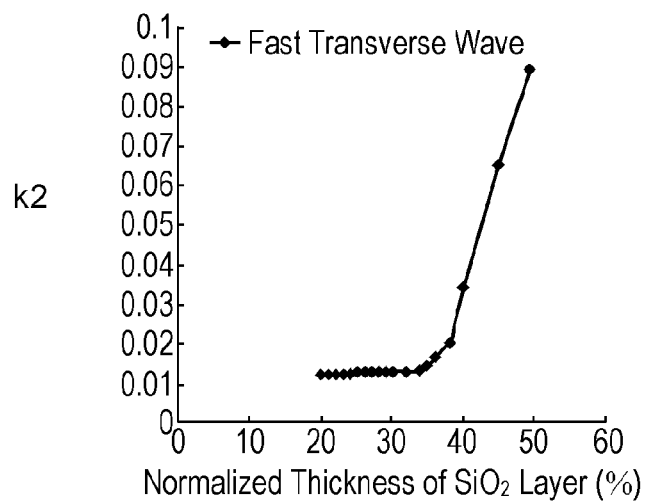
FIG. 21A is a characteristic diagram of variation of the conventional acoustic wave device where the piezoelectric substrate is made of a lithium niobate material having the Euler angles (0°, −87.5°, 0°), the electrodes are made of copper with a thickness of $0.03\lambda$, and the protective layer is made of silicon oxide and has a planar upper surface, when the thickness of the protective layer is varied.
Figure 21B:
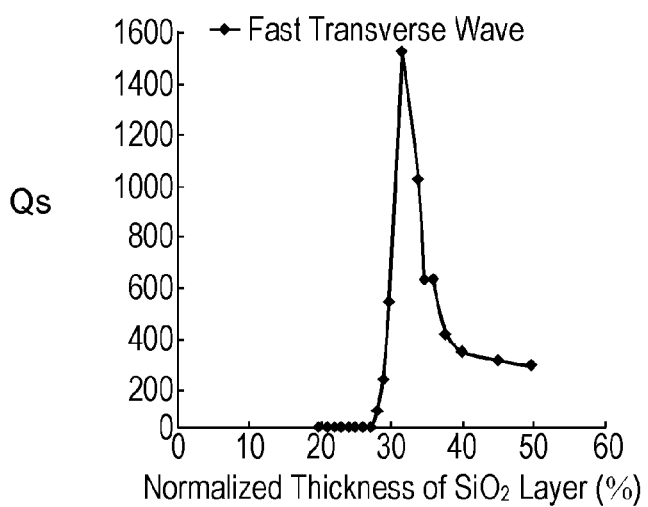
FIG. 21B is a characteristic diagram of variation of the conventional acoustic device where the piezoelectric substrate is made of a lithium niobate material having the Euler angles (0°, −87.5°, 0°), the electrodes are made of copper with a thickness of $0.03\lambda$, and the protective layer is made of silicon oxide and has a planar upper surface, when the thickness of the protective layer is varied.
Figure 21C:
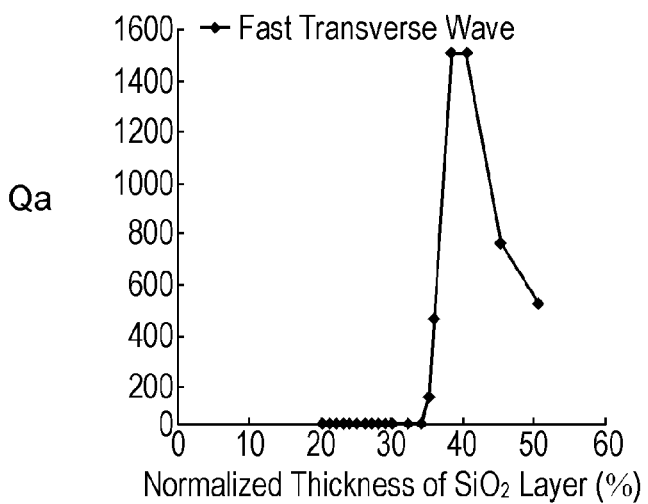
FIG. 21C is a characteristic diagram of variation of the conventional acoustic device where the piezoelectric substrate is made of a lithium niobate material having the Euler angles (0°, −87.5°, 0°), the electrodes are made of copper with a thickness of $0.03\lambda$, and the protective layer is made of silicon oxide and has a planar upper surface, when the thickness of the protective layer is varied.
Figure 22A:
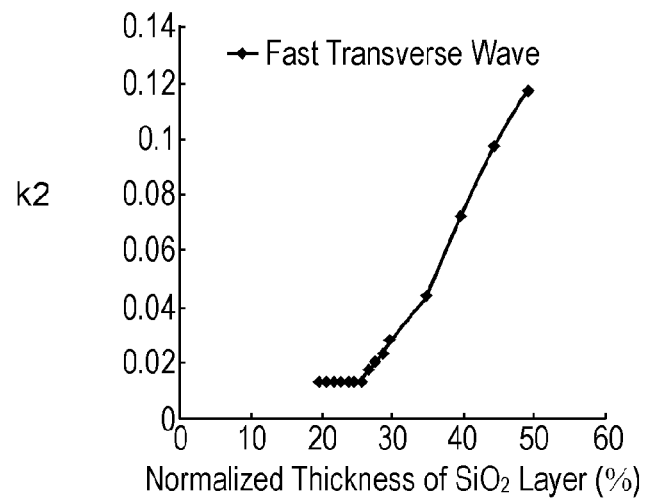
FIG. 22A is a characteristic diagram of variation of the conventional acoustic wave device when the thickness of a protective layer is varied.
Figure 22B:
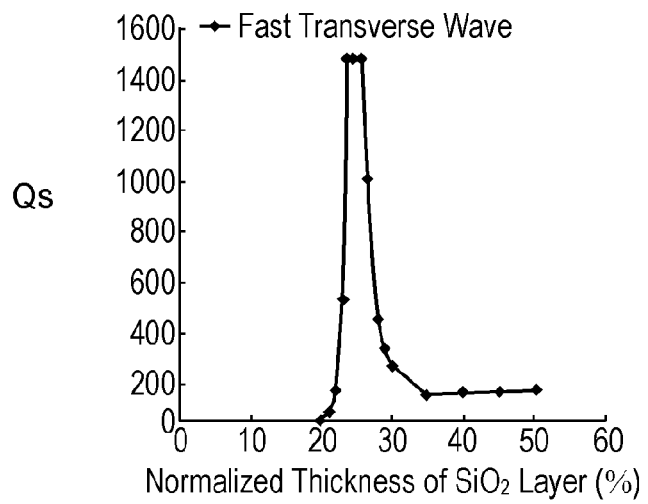
FIG. 22B is a characteristic diagram of variation of the conventional acoustic wave device, when the thickness of the protective layer is varied.
Figure 22C:
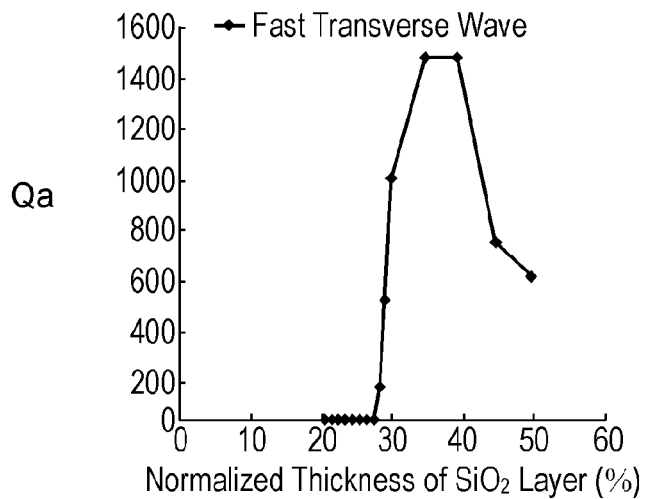
FIG. 22C is a characteristic diagram of variation of the conventional acoustic wave device when the thickness of the protective layer is varied.
Figure 23A:
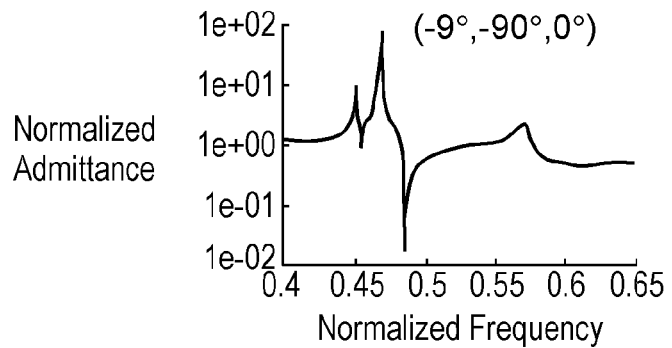
FIG. 23A is a characteristic diagram of the conventional acoustic wave device when $\phi$ of the Euler angles ($\phi$, $\theta$, $\psi$) of the piezoelectric substrate changes.
Figure 23B:
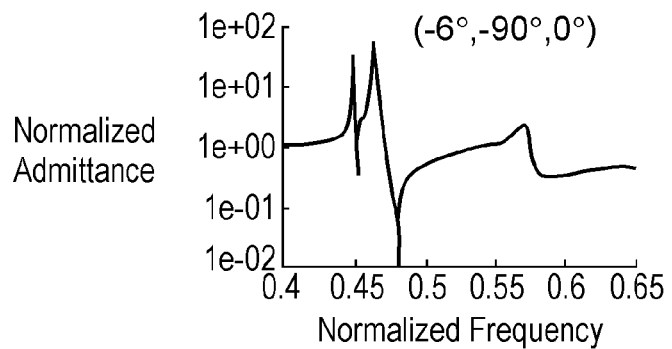
FIG. 23B is a characteristic diagram of the conventional acoustic wave device when $\phi$ of the Euler angles ($\phi$, $\theta$, $\psi$) of the piezoelectric substrate changes.
Figure 23C:
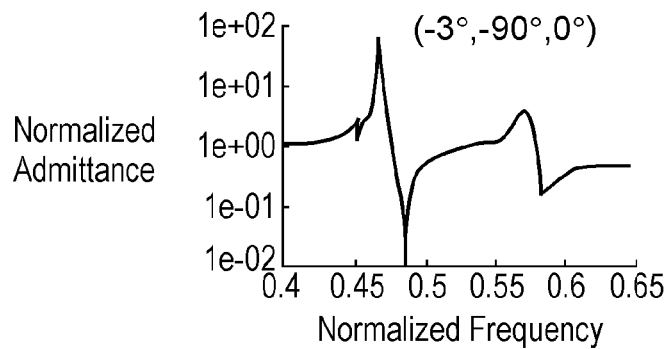
FIG. 23C is a characteristic diagram of the conventional acoustic wave device when $\phi$ of the Euler angles ($\phi$, $\theta$, $\psi$) of the piezoelectric substrate changes.
Figure 23D:
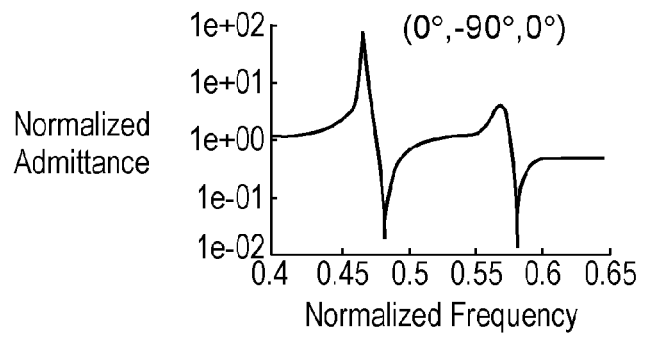
FIG. 23D is a characteristic diagram of the conventional acoustic wave device when $\phi$ of the Euler angles ($\phi$, $\theta$, $\psi$) of the piezoelectric substrate changes.
Figure 23E:
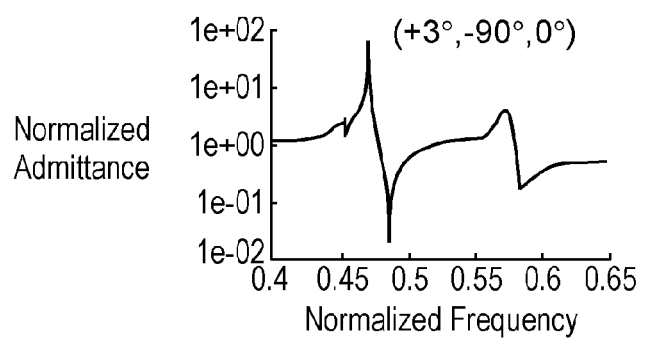
FIG. 23E is a characteristic diagram of the conventional acoustic wave device when $\phi$ of the Euler angles ($\phi$, $\theta$, $\psi$) of the piezoelectric substrate changes.
Figure 23F:
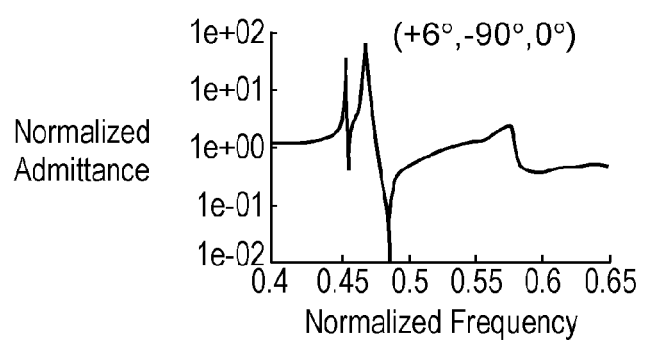
FIG. 23F is a characteristic diagram of the conventional acoustic wave device when $\phi$ of the Euler angles ($\phi$, $\theta$, $\psi$) of the piezoelectric substrate changes.
Figure 23G:
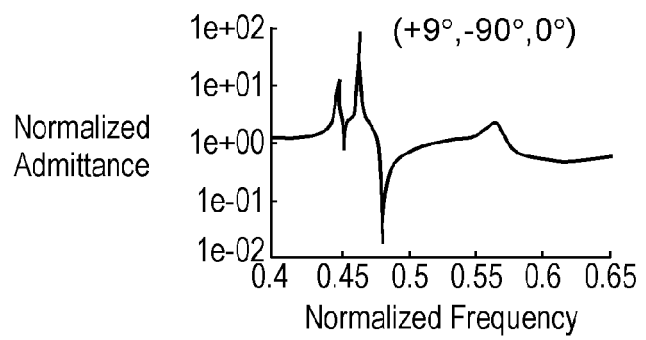
FIG. 23G is a characteristic diagram of the conventional acoustic wave device when $\phi$ of the Euler angles ($\phi$, $\theta$, $\psi$) of the piezoelectric substrate changes.
Figure 24A:
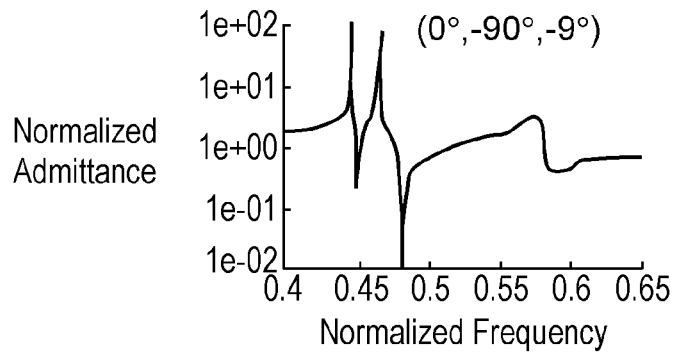
FIG. 24A is a characteristic diagram of the conventional acoustic wave device when $\psi$ of the Euler angles ($\phi$, $\theta$, $\psi$) of the piezoelectric substrate changes.
Figure 24B:
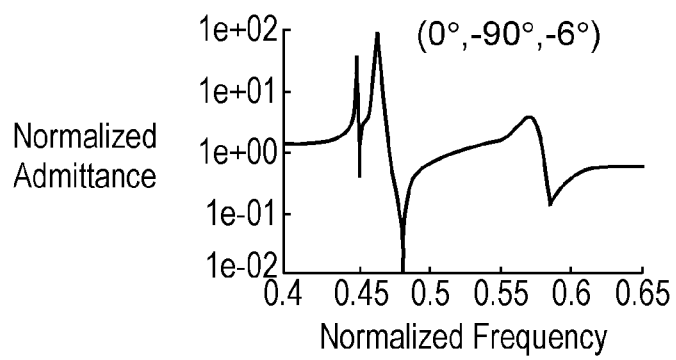
FIG. 24B is a characteristic diagram of the conventional acoustic wave device when $\psi$ of the Euler angles ($\phi$, $\theta$, $\psi$) of the piezoelectric substrate changes.
Figure 24C:
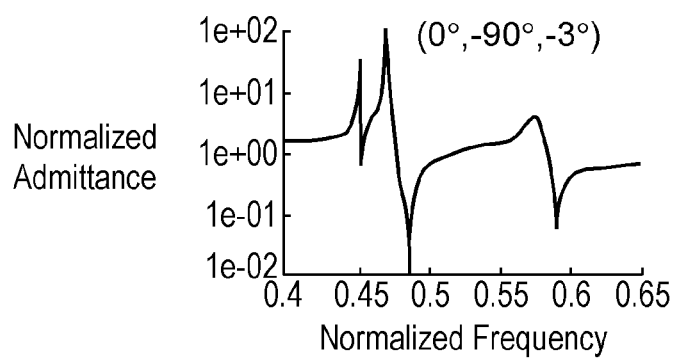
FIG. 24C is a characteristic diagram of the conventional acoustic wave device when $\psi$ of the Euler angles ($\phi$, $\theta$, $\psi$) of the piezoelectric substrate changes.
Figure 24D:
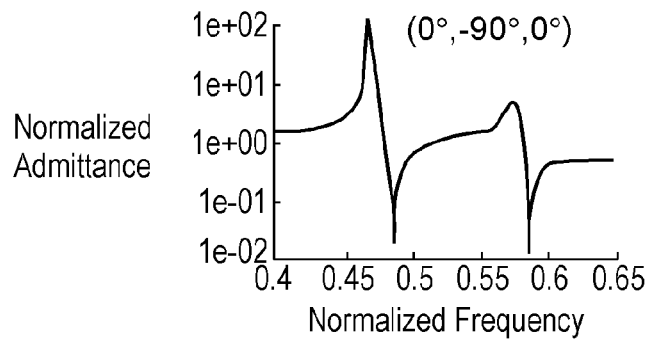
FIG. 24D is a characteristic diagram of the conventional acoustic wave device when $\psi$ of the Euler angles ($\phi$, $\theta$, $\psi$) of the piezoelectric substrate changes.
Figure 24E:
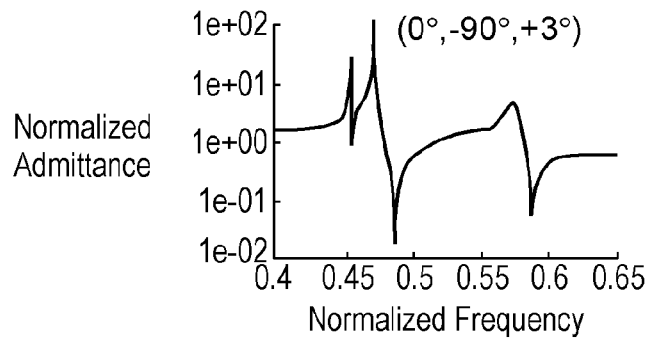
FIG. 24E is a characteristic diagram of the conventional acoustic wave device when $\psi$ of the Euler angles ($\phi$, $\theta$, $\psi$) of the piezoelectric substrate changes.
Figure 24F:
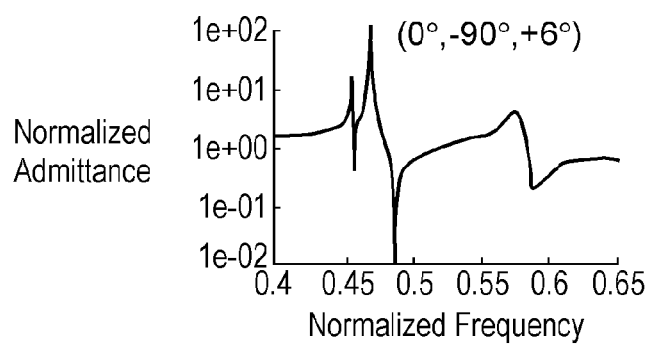
FIG. 24F is a characteristic diagram of the conventional acoustic wave device when $\psi$ of the Euler angles ($\phi$, $\theta$, $\psi$) of the piezoelectric substrate changes.
Figure 24G:
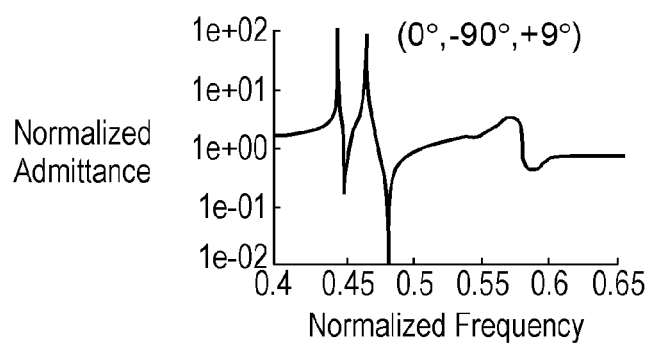
FIG. 24G is a characteristic diagram of the conventional acoustic wave device when $\psi$ of the Euler angles ($\phi$, $\theta$, $\psi$) of the piezoelectric substrate changes.

The series resonator 7A includes, as shown in FIG. 17, an interdigital transducer electrode 410 which includes comb-shaped electrodes 10A and 10B facing each other and disposed on the piezoelectric substrate 6. The parallel resonator 8A includes an interdigital transducer electrode 412 which includes comb-shaped electrodes 12A and 12B facing each other and disposed on the piezoelectric substrate 6.

The comb-shaped electrodes 10A and 10B and the comb-shaped electrodes 12A and 12B are arranged such that the interdigitating width of electrode fingers of the comb-shaped electrodes becomes shorter from the center to both ends.

In this arrangement, the interditating width weighing coefficient of the interdigital transducer electrode 410 of the series resonator 7A is smaller than the interdigitating width weighing coefficient of the interdigital transducer electrode 412 of the parallel resonator 8A.

The interdigitating width weighing coefficient is the ratio of a non-facing electrode area where the electrode fingers do not interdigitate on an excitation area. In the series resonator 7A, the weighing coefficient is the ratio of the sum of the non-facing electrode areas 14A, 14B, 14C, and 14D to the excitation area 413. In the parallel resonator 8A, the weighing coefficient is the ratio of the sum of the non-facing electrode areas 16A, 16B, 16C, and 16D to the excitation area 415. According to this embodiment, the interdigitating width weighing coefficient of the interdigital transducer electrode 410 is approximately 0.3 while the interdigitating width weighing coefficient of the interdigital transducer electrode 412 is approximately 0.5.

With the above described arrangement, the Q value at the resonant point of the series resonator 7A can be high while the Q value at the anti-resonant point of the parallel resonator 8A remains high.

As set forth above, an acoustic wave devices according to the present invention are advantageous for practical use where, when the thickness of a protective layer is greater than a predetermined size, undesired spurious emissions generated by a fast transverse wave can be attenuated while the generation of undesired spurious emissions on the Rayleigh wave is suppressed. The acoustic wave devices according to the present invention are hence applicable to a duplexer and electronic apparatus, such as a mobile telephone.

REFERENCE NUMERALS 5, 15, 35, 45 Acoustic Wave Device
6, 16, 21 Piezoelectric Substrate
6A, 6B Input And Output Terminal
7, 17 Electrode
7A, 7B, 7C Series Resonator
8, 18, 24 Protective Layer
8A, 8B Parallel Resonator
9 Projection
10 Top
10A, 10B, 12A, 12B, 112, 113, 122, 132, 212, 213, 222, 232 Comb-Shaped Electrode
11 Bottom
14A, 14B, 14C, 14D, 16A, 16B, 16C, 16D Non-Facing Electrode Area
20 First Filter
22 Electrode Layer
23, 25 Resist Layer
26 Pad
30 Semiconductor Integrated Circuit Device
31 Second Filter
32 Duplexer
33 Filter
40 Reproducing Device
50 Electronic Apparatus
100 First Acoustic Wave Resonator
110, 210, 410, 412 Interdigital Transducer Electrode
111, 114, 121, 131, 211, 214, 221, 231 Bus Bar
120, 130, 220, 230 Grating Reflector
133 Connecting Line
200 Second Acoustic Wave Resonator
302 Input Terminal
304 Output Terminal
413, 415 Excitation Area

The invention claimed is:

1. An acoustic wave device comprising:
a piezoelectric substrate made of a lithium niobate material having Euler angles ($\phi$, $\theta$, $\psi$), the Euler angles satisfying conditions of $-20° \leq \phi \leq 20°$, $-100° \leq \theta \leq -60°$, $1.193\phi - 2° \leq \psi \leq 1.193\phi + 2°$, and either $\psi \leq -2\phi - 3°$ or $-2\phi + 3° \leq \psi$, the conditions simultaneously suppressing spurious transmissions derived from a Rayleigh wave and from a fast transverse wave excited in the piezoelectric substrate, the fast transverse wave being a fastest wave of transverse waves produced in the acoustic wave device;
an inter-digital transducer (IDT) electrode disposed on the piezoelectric substrate and configured to excite a major acoustic wave of a wavelength $\lambda$; and
a protective layer disposed on the piezoelectric substrate and covering the IDT electrode, the protective layer having a thickness greater than $0.27\lambda$.

2. The acoustic wave device of claim 1 wherein the protective layer is made of a silicon oxide film.

3. A duplexer comprising:
a first filter; and
a second filter having a passing frequency range higher than a passing frequency range of the first filter, the first filter including the acoustic wave device of claim 1.

4. An electronic apparatus comprising:
the acoustic wave device of claim 1; and
a semiconductor integrated circuit device connected to the acoustic wave device.

5. The acoustic wave device of claim 1 wherein the IDT electrode is copper and has a normalized thickness of $0.03\lambda$.

6. The acoustic wave device of claim 1 wherein the piezoelectric substrate has a first thermal characteristic and the protective layer has a second thermal characteristic opposite to the first thermal characteristic.

7. An acoustic wave device comprising:
a piezoelectric substrate made of a lithium niobate material having Euler angles ($\phi$, $\theta$, $\psi$), the Euler angles satisfying, $-20° \leq \phi \leq 20°$, $-100° \leq \theta \leq -60°$, $1.193\phi - 2° \leq \psi \leq 1.193\phi + 2°$, and either $\psi \leq -2\phi - 3°$ or $-2\phi + 3° \leq \psi$, the conditions simultaneously suppressing spurious transmissions derived from a Rayleigh wave and from a fast transverse wave excited in the piezoelectric substrate, the fast transverse wave being a fastest wave of transverse waves produced in the acoustic wave device;

an inter-digital transducer (IDT) electrode disposed on the piezoelectric substrate and configured to excite a major acoustic wave of a wavelength $\lambda$; and a protective layer disposed on the piezoelectric substrate and covering the IDT electrode, the protective layer having a thickness greater than $0.2\lambda$ and a projection disposed above an electrode finger of the IDT electrode, a width of a top of the projection being smaller than a width of the electrode finger of the IDT electrode.

8. The acoustic wave device of claim 7 wherein the projection of the protective layer has a curved side thereof projecting downwardly while extending from the top of the projection to a bottom of the projection.

9. The acoustic wave device of claim 7 wherein the width of the top of the projection is not greater than half of the width of the electrode finger of the IDT electrode.

10. The acoustic wave device of claim 7 wherein a center of the top of the projection is aligned substantially above a center of the electrode finger of the IDT electrode.

11. The acoustic wave device of claim 7 wherein a height T of the projection and a thickness h of the IDT electrode satisfies $0.03\lambda < T \leq h$.

12. The acoustic wave device of claim 7 wherein the protective layer is made of a silicon oxide film.

13. A duplexer comprising:

a first filter; and a second filter having a passing frequency range higher than a passing frequency range of the first filter, the first filter including the acoustic wave device of claim 7.

14. An electronic apparatus comprising:

an acoustic wave device of claim 7; and a semiconductor integrated circuit device connected to the acoustic wave device.

15. The acoustic wave device of claim 7 wherein the IDT electrode includes a plurality of electrode fingers, and the protective film includes a corresponding plurality of projections, each projection being aligned substantially above each electrode finger.

* * * * *